United States Patent
Han

(10) Patent No.: US 11,765,913 B2
(45) Date of Patent: Sep. 19, 2023

(54) MEMORY DEVICES

(71) Applicant: SAMSUNG ELECTRONICS CO., LTD., Suwon-si (KR)

(72) Inventor: Minchul Han, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 159 days.

(21) Appl. No.: 17/027,968

(22) Filed: Sep. 22, 2020

(65) Prior Publication Data
US 2021/0151505 A1    May 20, 2021

(30) Foreign Application Priority Data

Nov. 19, 2019    (KR) .................... 10-2019-0148845

(51) Int. Cl.
| | |
|---|---|
| H10B 63/00 | (2023.01) |
| H10B 61/00 | (2023.01) |
| H10N 50/01 | (2023.01) |
| H10N 50/80 | (2023.01) |
| H10N 70/20 | (2023.01) |
| H10N 70/00 | (2023.01) |

(52) U.S. Cl.
CPC ........... *H10B 63/80* (2023.02); *H10B 61/10* (2023.02); *H10B 63/24* (2023.02); *H10N 50/01* (2023.02); *H10N 50/80* (2023.02); *H10N 70/063* (2023.02); *H10N 70/231* (2023.02); *H10N 70/24* (2023.02)

(58) Field of Classification Search
CPC .................................................. H01L 27/2427
See application file for complete search history.

(56) References Cited

U.S. PATENT DOCUMENTS

| | | |
|---|---|---|
| 7,688,622 B2 | 3/2010 | Kang et al. |
| 9,024,374 B2 | 5/2015 | Hung et al. |
| 9,118,009 B2 | 8/2015 | Terai et al. |
| 9,246,100 B2 | 1/2016 | Ravasio et al. |
| 9,559,146 B2 | 1/2017 | Liu et al. |
| 9,812,206 B2 | 11/2017 | Nam et al. |
| 9,997,570 B2 | 6/2018 | Toriyama et al. |
| 10,008,665 B1 | 6/2018 | Gealy et al. |
| 2007/0132049 A1 | 6/2007 | Stipe |
| 2021/0104576 A1* | 4/2021 | Lee ............... H01L 27/2427 |

FOREIGN PATENT DOCUMENTS

KR    1020140133268    11/2014

* cited by examiner

*Primary Examiner* — Mounir S Amer
(74) *Attorney, Agent, or Firm* — F. Chau & Associates, LLC

(57) ABSTRACT

A memory device includes a substrate including a memory cell region and a dummy cell region, a plurality of first conductive lines disposed on the substrate and extending in a first direction, a plurality of second conductive lines disposed on the substrate and extending in a second direction, and a plurality of memory cells formed at intersections of the plurality of first conductive lines and the plurality of second conductive lines. Each of the plurality of memory cells includes a switching unit and a variable resistance memory unit. Each of the plurality of first conductive lines includes a first conductive line main region disposed in the memory cell region, and a first conductive line edge region disposed in the dummy cell region and spaced apart from the first conductive line main region.

20 Claims, 42 Drawing Sheets

MEMORY DEVICES

CROSS-REFERENCE TO RELATED APPLICATIONS

This application claims priority under 35 U.S.C. § 119 to Korean Patent Application No. 10-2019-0148845, filed on Nov. 19, 2019 in the Korean Intellectual Property Office, the disclosure of which is incorporated by reference herein in its entirety.

TECHNICAL FIELD

Exemplary embodiments of the inventive concept relate to a memory device, and more particularly, to a memory device having a cross point array structure.

DISCUSSION OF THE RELATED ART

There is a growing demand for high integration of memory devices in response to a trend of electronic products becoming thinner and smaller. Memory devices having a three-dimensional cross point structure have been proposed in which memory cells are arranged at intersections between two electrodes crossing each other. Ovonic threshold switching materials, which are used as select elements of the memory devices having cross point structures, are relatively weak in thermal or chemical stability, and are prone to being damaged in a manufacturing process of the memory devices. Accordingly, the reliability of such memory devices is reduced.

SUMMARY

Exemplary embodiments of the inventive concept provide a cross point-type memory device capable of ensuring a stable operation of a memory cell even when damage is caused to ovonic threshold switching materials in an edge region in an etching process of a cross point array.

In an exemplary embodiment, a memory device includes a substrate including a memory cell region and a dummy cell region, a plurality of first conductive lines disposed on the substrate and extending in a first direction, a plurality of second conductive lines disposed on the substrate and extending in a second direction, and a plurality of memory cells formed at intersections of the plurality of first conductive lines and the plurality of second conductive lines. Each of the plurality of memory cells includes a switching unit and a variable resistance memory unit. Each of the plurality of first conductive lines includes a first conductive line main region disposed in the memory cell region, and a first conductive line edge region disposed in the dummy cell region and spaced apart from the first conductive line main region.

In an exemplary embodiment, a memory device includes a substrate including a memory cell region and a dummy cell region, a plurality of first conductive lines disposed on the substrate and extending in a first direction, a plurality of second conductive lines disposed on the substrate and extending in a second direction, a plurality of first memory cells formed at intersections of the plurality of first conductive lines and the plurality of second conductive lines, each of the plurality of first memory cells including a first switching unit and a first variable resistance memory unit, and a first line isolation insulating layer extending in the dummy cell region in the second direction and including a top surface substantially aligned with a top surface of the plurality of first conductive lines. Each of the plurality of first conductive lines includes a first conductive line main region disposed in the memory cell region, and a first conductive line edge region disposed in the dummy cell region and spaced apart from the first conductive line main region with the first line isolation insulating layer disposed therebetween.

In an exemplary embodiment, a memory device includes a substrate including a memory cell region and a dummy cell region, a plurality of first conductive lines disposed on the substrate and extending in a first direction, a plurality of second conductive lines disposed on the plurality of first conductive lines and extending in a second direction, a plurality of third conductive lines disposed on the plurality of second conductive lines and extending in the first direction, and a plurality of memory cells formed at intersections of the plurality of first conductive lines and the plurality of second conductive lines and at intersections of the plurality of second conductive lines and the plurality of third conductive lines. Each of the plurality of memory cells includes a switching unit and a variable resistance memory unit. The memory device further includes a first line isolation insulating layer extending in the dummy cell region in the second direction and including a top surface that is substantially aligned with a top surface of the plurality of first conductive lines, and a second line isolation insulating layer extending in the dummy cell region in the first direction and including a top surface that is substantially aligned with a top surface of the plurality of second conductive lines.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
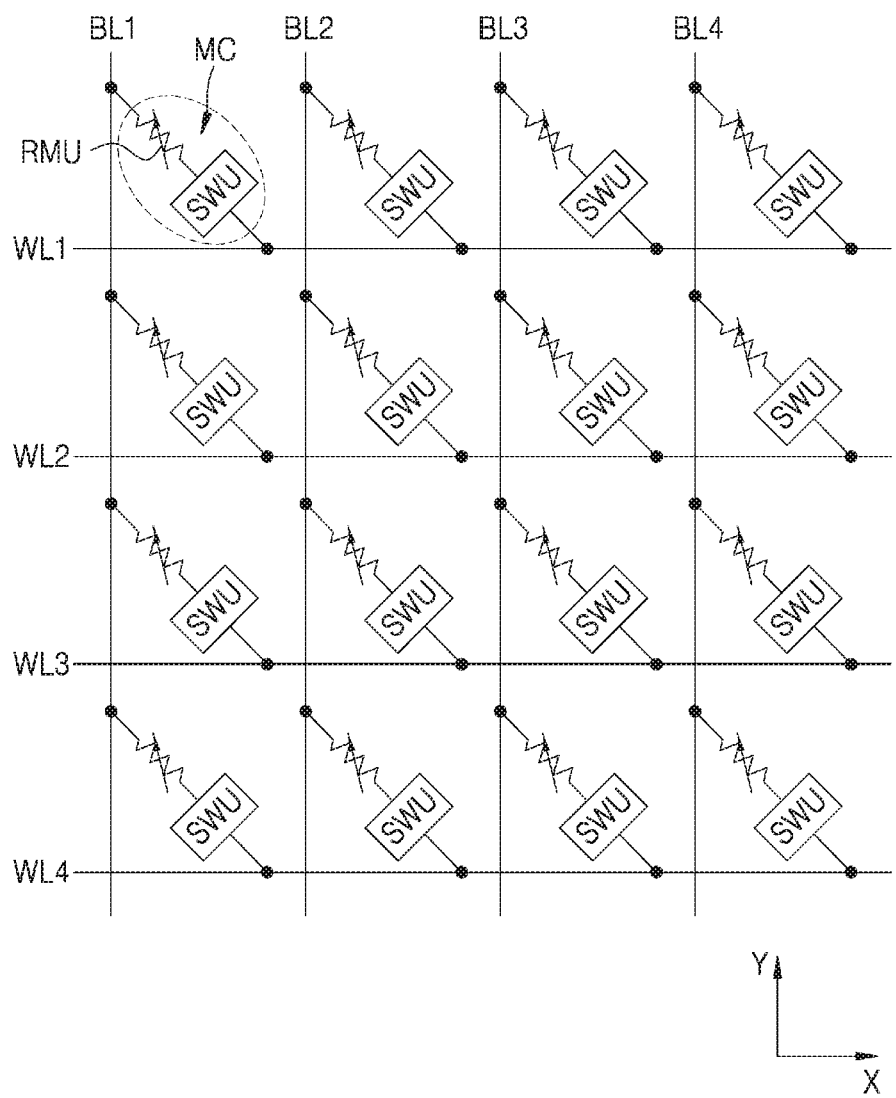
FIG. 1 illustrates an equivalent circuit of a memory device according to exemplary embodiments.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two surfaces are described as being substantially coplanar or substantially aligned with each other, the two surfaces may be exactly coplanar or exactly aligned with each other, or may be approximately coplanar or approximately aligned with each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of the words "substantially" and "about" should be construed in a like manner.

FIG. 1 illustrates an equivalent circuit of a memory device 10 according to exemplary embodiments.

Referring to FIG. 1, the memory device 10 may include a plurality of word lines WL1, WL2, WL3, and WL4 extending in a first direction (e.g., the X direction in FIG. 1), and a plurality of bit lines BL1, BL2, BL3, and BL4 extending in a second direction (e.g., the Y direction in FIG. 1) crossing the first direction (e.g., perpendicular to the first direction). Each of the plurality of memory cells MC may be connected to the plurality of word lines WL1, WL2, WL3, and WL4 and the plurality of bit lines BL1, BL2, BL3, and BL4. Each of the plurality of memory cells MC may include a variable resistance memory unit RMU for storing information and a switching unit SWU for selecting the memory cell MC. The switching unit SWU may also be referred to as a select device or an accessor device. The plurality of memory cells MC may be formed at intersections of the plurality of word lines WL1, WL2, WL3, and WL4 and the plurality of bit lines BL1, BL2, BL3, and BL4.

For example, as the switching unit SWU of the memory cell MC selected via the plurality of word lines WL1, WL2, WL3, and WL4 and the plurality of bit lines BL1, BL2, BL3, and BL4 is turned on, a voltage may be applied to the variable resistance memory unit RMU of the memory cell MC, and a current may flow in the variable resistance memory unit RMU. For example, the variable resistance memory unit RMU may include a phase-change material layer that is reversibly switched between a first state and a second state. However, the variable resistance memory unit RMU is not limited thereto, and may include any variable resistor of which resistance varies according to an applied voltage. For example, the resistance of the variable resistance memory unit RMU may reversibly transition between the first state and the second state according to a voltage applied to the variable resistance memory unit RMU of the selected memory cell MC.

Digital information, such as '0' or '1', may be stored in the memory cell MC depending on resistance variation of the variable resistance memory unit RMU, and accordingly, the digital information may be erased from the memory cell MC. For example, data may be written as a high-resistance state '0' and a low-resistance state '1' in the memory cell MC. However, the memory cell MC according to exemplary embodiments of the inventive concept is not limited to the above-described digital information of the high-resistance state '0' and the low-resistance state '1' and may store other various resistance states.

A memory cell MC may be addressed by selecting the plurality of word lines WL1, WL2, WL3, and WL4 and the plurality of bit lines BL1, BL2, BL3, and BL4, the memory cell MC may be programmed by applying a certain signal between the plurality of word lines WL1, WL2, WL3, and WL4 and the plurality of bit lines BL1, BL2, BL3, and BL4, and information according to a resistance value of the variable resistance memory unit RMU constituting the corresponding memory cell MC may be read by measuring a current value via the plurality of bit lines BL1, BL2, BL3, and BL4.

Figure 2A:
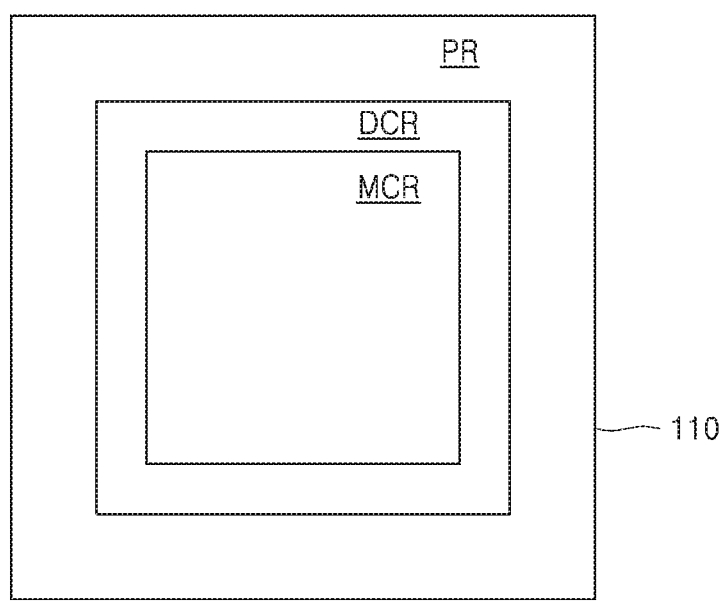
FIG. 2A is a plan view of a memory device according to exemplary embodiments.
Figure 2A:
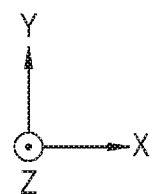
Figure 2B:
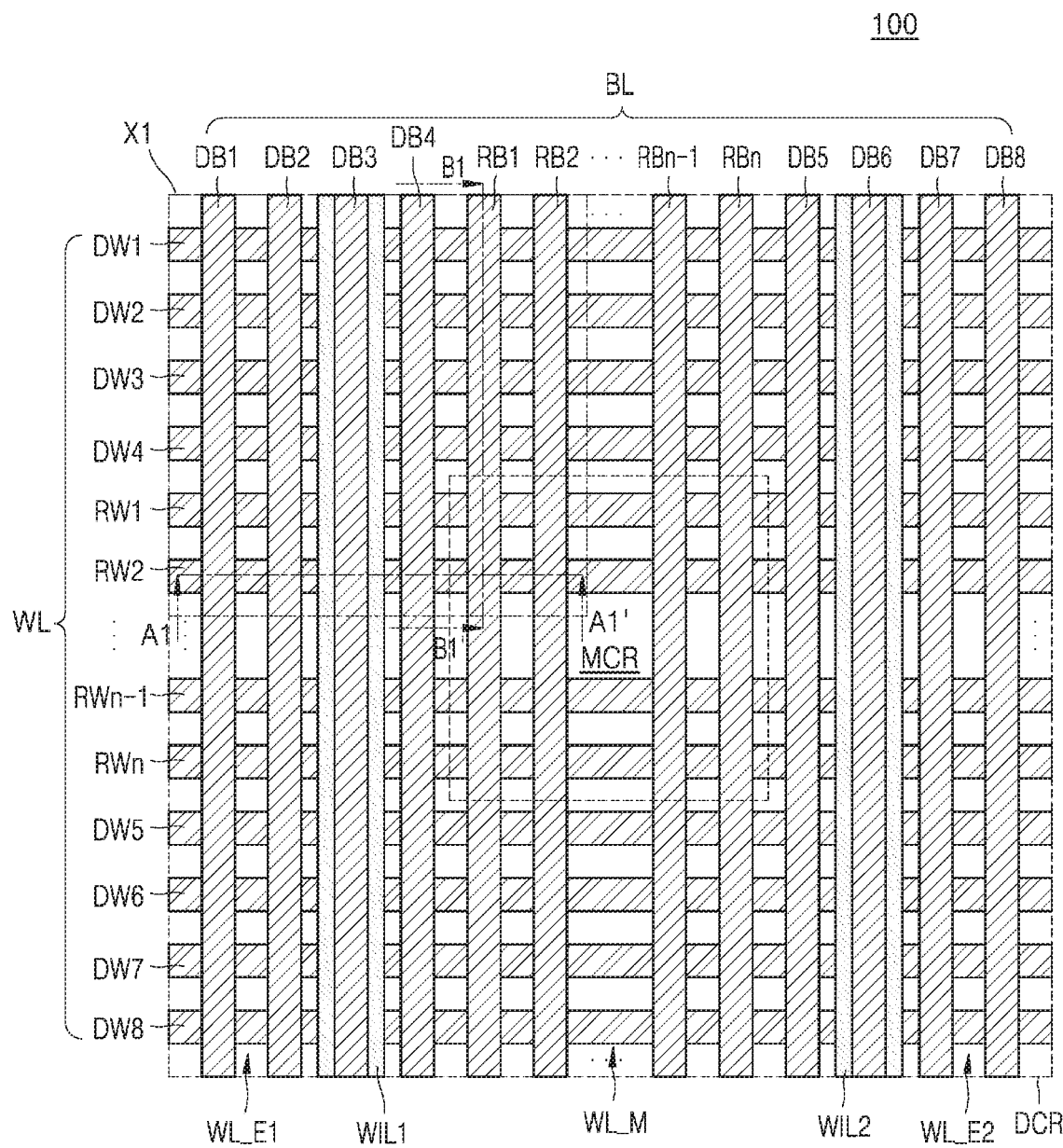
FIG. 2B is a layout diagram illustrating a schematic configuration of the memory device of FIG. 2A.
Figure 2B:
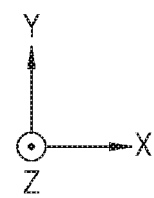
Figure 3:
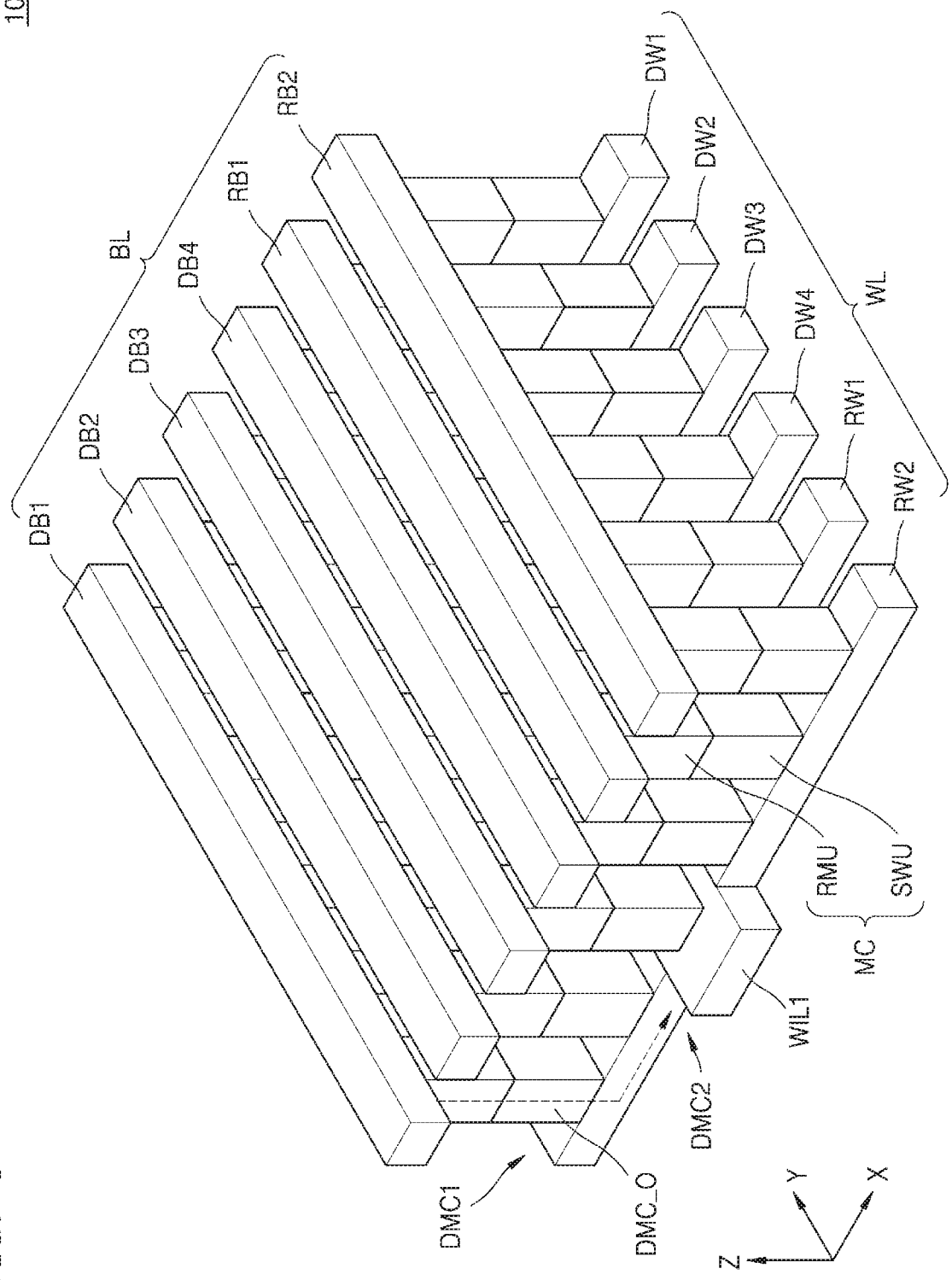
FIG. 3 is a schematic perspective view of a portion X1 in FIG. 2B.
Figure 4:
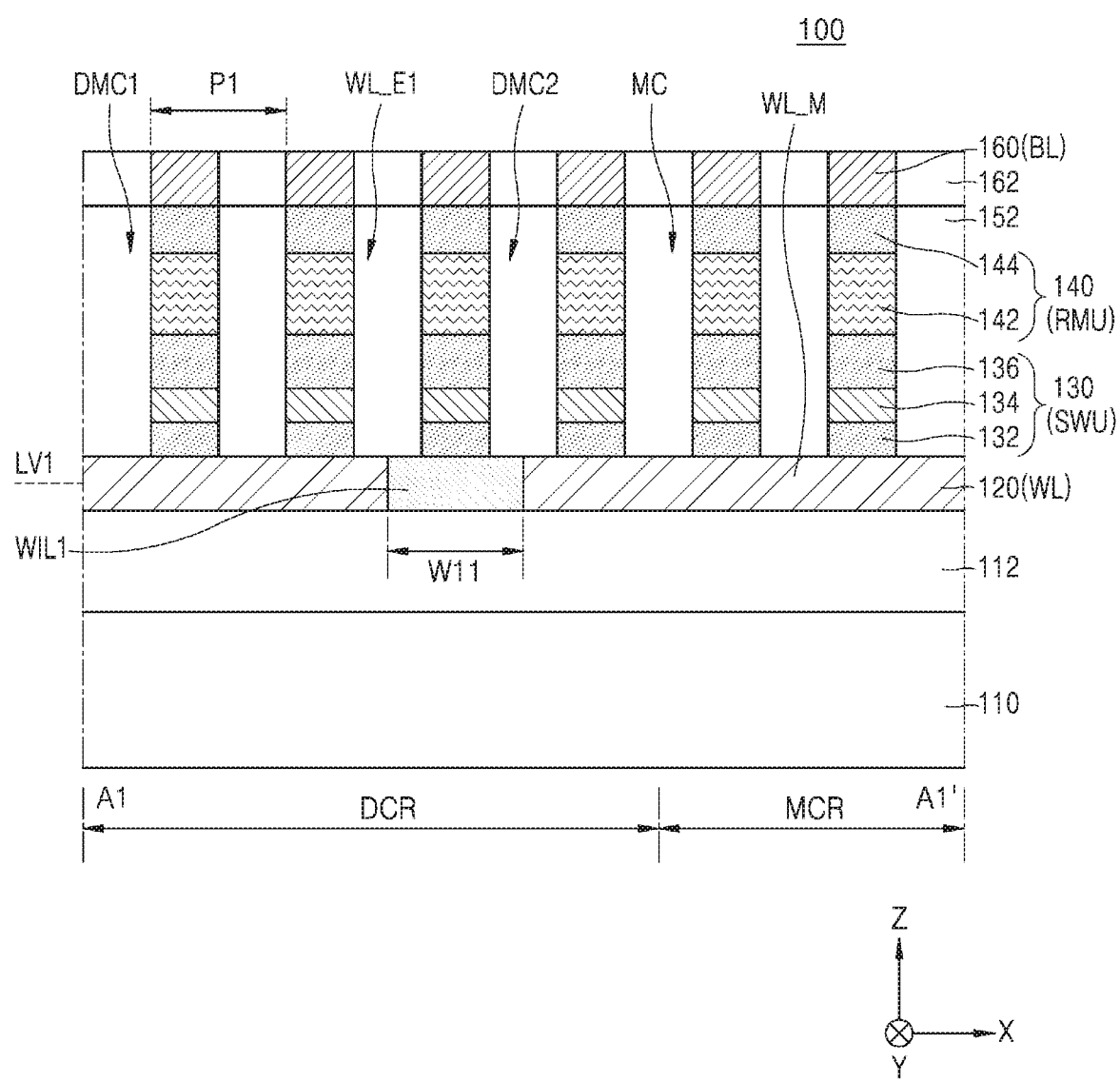
FIG. 4 is a cross-sectional view taken along line A1-A1' in FIG. 2B.
Figure 5:
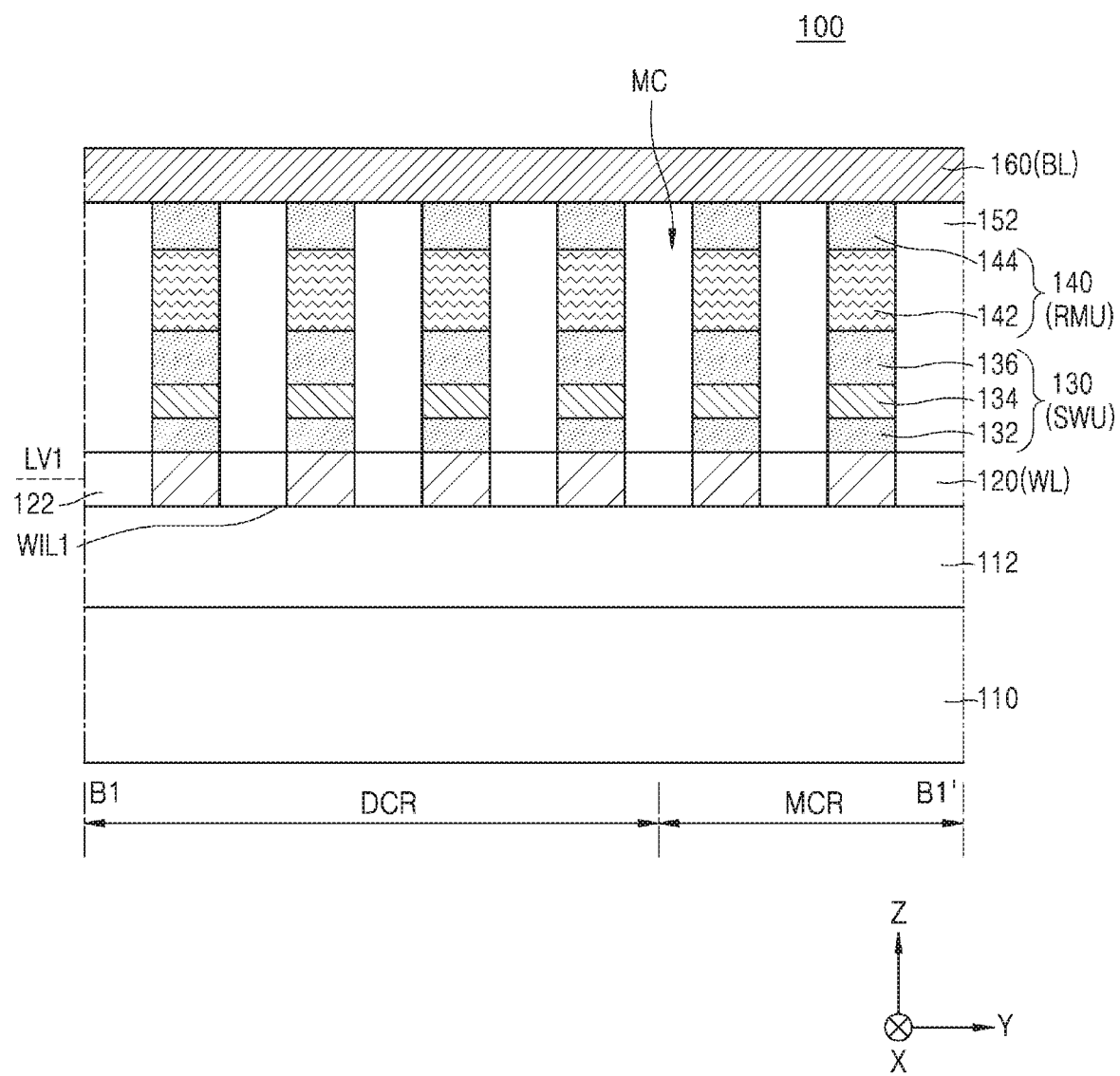
FIG. 5 is a cross-sectional view taken along line B1-B1' in FIG. 2B.
Figure 6:
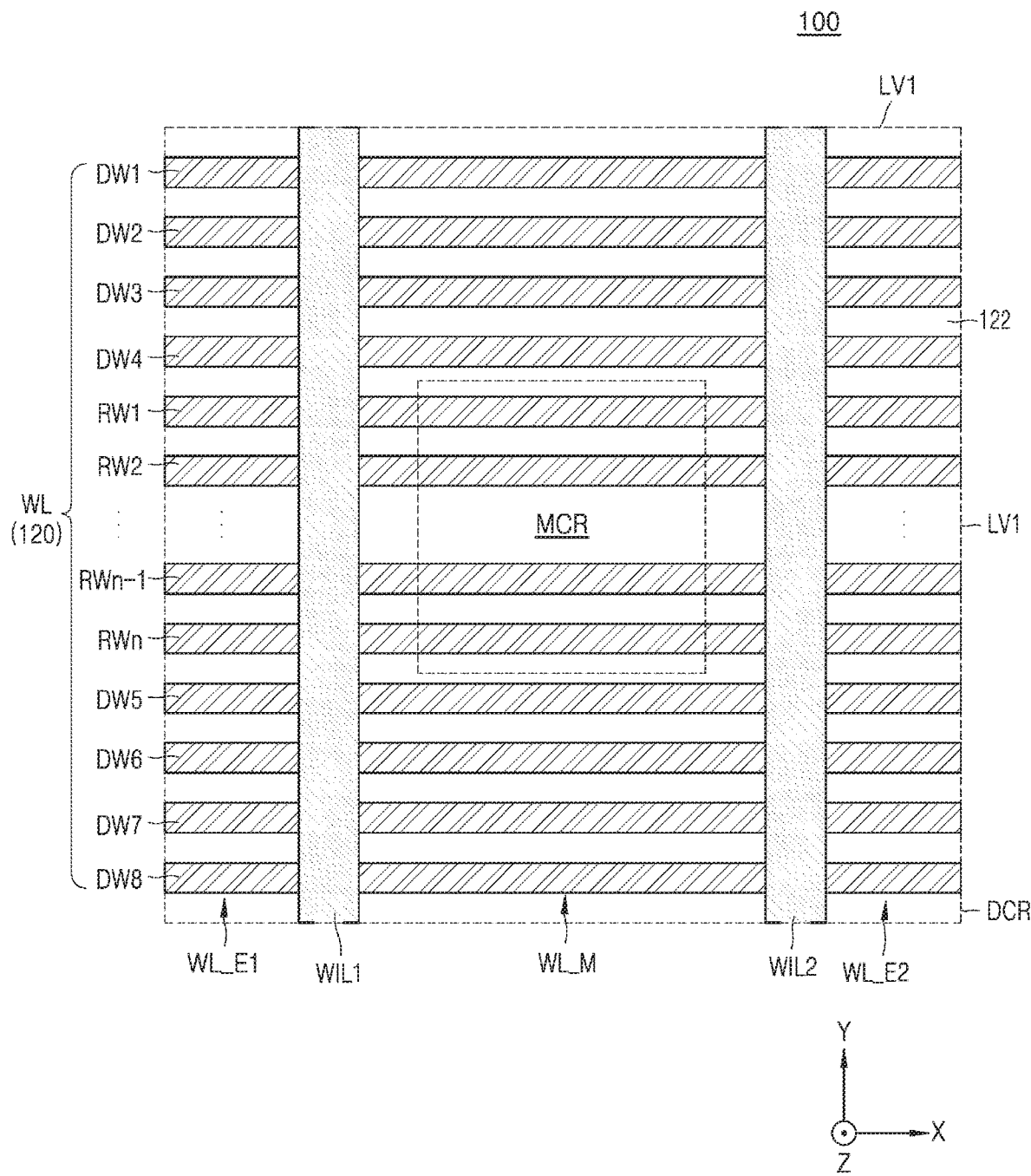
FIG. 6 is a horizontal cross-sectional view taken at a first level LV1 in FIG. 4.

FIG. 2A is a plan view illustrating a memory device 100 according to exemplary embodiments. FIG. 2B is a layout diagram illustrating a schematic configuration of the memory device 100 of FIG. 2A. FIG. 3 is a schematic perspective view of a portion X1 in FIG. 2B. FIG. 4 is a cross-sectional view taken along line A1-A1' in FIG. 2B. FIG. 5 is a cross-sectional view taken along line B1-B1' in FIG. 2B. FIG. 6 is a horizontal cross-sectional view taken at a first level LV1 in FIG. 4.

Referring to FIGS. 2A through 6, the memory device 100 may include a substrate 110 including a memory cell region MCR, a dummy cell region DCR, and a peripheral circuit region PR.

The memory cell region MCR including a plurality of memory cells MC may be in the center portion of the substrate 110, and the dummy cell region DCR may surround the memory cell region MCR in a plan view. In exemplary embodiments, the dummy cell region DCR may completely surround the memory cell region MCR. The peripheral circuit region PR may surround the dummy cell region DCR in a plan view. In exemplary embodiments, the peripheral circuit region PCR may completely surround the dummy cell region DCR.

In the peripheral circuit region PR, a plurality of transistors constituting a driving circuit for driving the plurality of memory cells MC may be formed on the substrate 110. For example, the driving circuit may include peripheral circuits capable of processing data input/output to/from the plurality of memory cells MC. For example, the peripheral circuits may include a page buffer, a latch circuit, a cache circuit, a column decoder, a sense amplifier, a data in/out circuit, a row decoder, etc.

In exemplary embodiments, unlike as illustrated in FIG. 2A, the peripheral circuit region PR may be disposed on one side of the memory cell region MCR and the dummy cell region DCR, or on both sides thereof. In exemplary embodiments, unlike as illustrated in FIG. 2A, the peripheral circuit region PR may be on a vertical level different from vertical levels of the memory cell region MCR and the dummy cell region DCR on the substrate 110, and may vertically overlap at least a portion of the memory cell region MCR and at least a portion of the dummy cell region DCR.

In the memory cell region MCR and the dummy cell region DCR, a plurality of first conductive lines 120 may be disposed on the substrate 110 and extend in the first direction (X direction), and a plurality of second conductive lines 160 may be disposed on the substrate 110 and extend in the second direction (Y direction) on a vertical level higher than the plurality of first conductive lines 120. For example, a vertical distance between the substrate 110 and the second conductive lines 160 may be greater than a vertical distance between the substrate 110 and the first conductive lines 120. The plurality of first conductive lines 120 may correspond to the plurality of word lines WL, for example, the plurality of word lines WL1, WL2, WL3 and WL4 (refer to FIG. 1), and the plurality of second conductive lines 160 may correspond to the plurality of bit lines BL, for example, the plurality of bit lines BL1, BL2, BL3, and BL4 (refer to FIG. 1).

In exemplary embodiments, when the first conductive lines 120 are described as extending in the first direction (X direction), it may mean that the first conductive lines 120 extend lengthwise in the first direction (X direction). Similarly, when the second conductive lines 160 are described as extending in the second direction (Y direction), it may mean that the second conductive lines 160 extend lengthwise in the second direction (Y direction). Other uses of the word "extend" with relation to other components and directions may be construed in a similar manner, unless the context clearly indicates otherwise.

As illustrated in FIG. 2B, the plurality of first conductive lines 120 may include first dummy conductive lines DW1 through DW8 and first normal conductive lines RW1, RW2, ..., RWn−1, and RWn, in which n is a natural number. For example, four first dummy conductive lines DW1, DW2, DW3, and DW4 may be disposed on one side of the first normal conductive lines RW1, RW2, ..., RWn−1, and RWn, and the other four first conductive lines DW5, DW6, DW7, and DW8 may be disposed on the other side of the first normal conductive lines RW1, RW2, ..., RWn−1, and RWn. The number and the arrangement of the first dummy conductive lines DW1 through DW8 are not limited thereto.

The plurality of second conductive lines 160 may include second dummy conductive lines DB1 through DB8 and second normal conductive lines RB1, RB2, ..., RBn−1, and RBn. For example, four second dummy conductive lines DB1, DB2, DB3, and DB4 may be disposed on one side of the second normal conductive lines RB1, RB2, ..., RBn−1, and RBn, and the other four dummy conductive lines DB5, DB6, DB7, and DB8 may be disposed on the other side of the second normal conductive lines RB1, RB2, ..., RBn−1, and RBn. However, the number and the arrangement of the second dummy conductive lines DB1 through DB8 are not limited thereto.

The plurality of first conductive lines 120 and the plurality of second conductive lines 160 may each include, for example, a metal, a conductive metal nitride, a conductive metal oxide, or a combination thereof. For example, the plurality of first conductive lines 120 and the plurality of second conductive lines 160 may each include W, WN, Au, Ag, Cu, Al, TiAlN, Jr, Pt, Pd, Ru, Zr, Rh, Ni, Co, Cr, Sn, Zn, ITO, an alloy thereof, or a combination thereof. In addition, the plurality of first conductive lines 120 and the plurality of second conductive lines 160 may each include a metal layer and a conductive barrier layer covering at least a portion of the metal layer. The conductive barrier layer may include, for example, Ti, TiN, Ta, TaN, or a combination thereof.

Each of the plurality of first conductive lines 120 may include a first conductive line main region WL_M and first conductive line edge regions WL_E1 and WL_E2 that are spaced apart from each other and arranged in a substantially straight line in the first direction (X direction). For example, the regions may be arranged in a line that is exactly straight in the first direction (X direction), or a line that is approximately straight in the first direction (X direction) as would be understood by a person having ordinary skill in the art (e.g., within a measurement error as would be understood by a person having ordinary skill in the art). The first conductive line main region WL_M may be disposed in the memory cell region MCR. For example, the first conductive line main region WL_M may overlap the memory cell region MCR. For example, one first conductive line edge region WL_E1 and another first conductive line edge region WL_E2 may be disposed on opposite sides of the first conductive line main region WL_M. The first conductive line edge regions WL_E1 and WL_E2 may be disposed in the dummy cell region DCR. For example, the first conductive line edge regions WL_E1 and WL_E2 may overlap the dummy cell region DCR. The first conductive line edge regions WL_E1 and WL_E2 may be spaced apart from the first conductive line main region WL_M. In exemplary embodiments, only one of the first conductive line edge regions WL_E1 and WL_E2 may be included in each of the plurality of first conductive lines 120.

First line isolation insulating layers WIL1 and WIL2 may extend in the second direction (Y direction) between the first conductive line main region WL_M and the first conductive line edge regions WL_E1 and WL_E2. The first line isolation insulating layers WIL1 and WIL2 may be disposed on the same vertical level as the plurality of first conductive lines 120. The first line isolation insulating layers WIL1 and WIL2 may electrically insulate and physically separate the first conductive line edge regions WL_E1 and WL_E2 from the first conductive line main region WL_M. The first line isolation insulating layers WIL1 and WIL2 may have a top surface on the same level as a top surface of each of the plurality of first conductive lines 120. For example, in exemplary embodiments, the top surface of the first line isolation insulating layers WIL1 and WIL2 and the top surface of each of the plurality of first conductive lines 120 may be substantially coplanar (e.g., substantially aligned with each other). The first line isolation insulating layers WIL1 and WIL2 may extend in the dummy cell region DCR in the second direction (Y direction). In addition, in exemplary embodiments, the first line isolation insulating layers WIL1 and WIL2 may have a bottom surface at the same level as a bottom surface of each of the plurality of first conductive lines 120. However, in exemplary embodiments, the bottom surface of the first line isolation insulating layers WIL1 and WIL2 may be at a lower level than the bottom surface of each of the plurality of first conductive lines 120.

The plurality of first conductive lines 120 may be disposed on a first vertical level from a top surface of the substrate 110, the first line isolation insulating layers WIL1 and WIL2 may be disposed on the same first vertical level, and the plurality of second conductive lines 160 may be disposed on a second vertical level from the top surface of the substrate 110 that is higher than the first vertical level.

The first line isolation insulating layers WIL1 and WIL2 may be at any location in the dummy cell region DCR. For example, although it is illustrated as an example in FIG. 2B that the first line isolation insulating layers WIL1 and WIL2 are formed at locations where they vertically overlap the second dummy conductive lines DB3 and DB6 that are the second closest to the memory cell region MCR, the first line isolation insulating layers WIL1 and WIL2 may be formed at locations where they vertically overlap the second dummy conductive lines DB4 and DB5 that are closest to the memory cell region MCR. In exemplary embodiments, the first line isolation insulating layers WIL1 and WIL2 may be formed at locations where they vertically overlap the second dummy conductive lines DB1 and DB8 arranged farthest from the memory cell region MCR.

As illustrated in FIG. 4, the first line isolation insulating layer WIL1 may have a first width W11 in the first direction (X direction), and the first width W11 may be about 100% to about 300% of a first pitch P1 of the second conductive lines 160 (e.g., the second conductive lines 160 may be disposed at the first pitch P1 in the first direction (X direction)). Similar to the first line isolation insulating layer WIL1 in exemplary embodiments, the first line isolation insulating layer WIL2 may have the first width W11 in the first direction (X direction).

In an example fabrication process, the plurality of first conductive lines 120 may be formed, the first conductive line main region WL_M and the first conductive line edge regions WL_E1 and WL_E2 may be formed by removing a portion of the plurality of first conductive lines 120 by using an additional patterning mask, and the first line isolation insulating layers WIL1 and WIL2 may be formed to fill a space from which the portion of the plurality of first conductive lines 120 is removed. When a double patterning method is used to form the plurality of first conductive lines 120 and the plurality of second conductive lines 160, since about 100% of the first pitch P1 corresponds to a minimum width that is realized by using a photolithography patterning, the first width W11 may be about 100% or more of the first pitch P1.

Alternatively, when the first width W11 is greater than about 300% of the first pitch P1, due to a relatively large height difference between the memory cell region MCR and the dummy cell region DCR, process difficulty may be increased in a process for patterning a switching unit 130 (e.g., corresponding to the switching unit SWU described above) and a variable resistance memory unit 140 (e.g., corresponding to the variable resistance memory unit RMU described above) on the first conductive line 120.

In the memory cell area MCR, the plurality of memory cells MC may be disposed between the plurality of first conductive lines 120 and the plurality of second conductive lines 160. For example, in a plan view, the plurality of memory cells MC may be at locations where the plurality of first conductive lines 120 and the plurality of second conductive lines 160 cross each other. The plurality of memory cells MC may be on the top surface of the first conductive line main region WL_M, and the plurality of second conductive lines 160 may be on the top surface of the plurality of memory cells MC.

In the dummy cell region DCR, a plurality of first dummy memory cells DMC1 may be disposed between the plurality of first conductive lines 120 and the plurality of second conductive lines 160, and a plurality of second dummy memory cells DMC2 may be disposed between the first line isolation insulating layers WIL1 and WIL2 and the second conductive lines 160 corresponding thereto. The first dummy memory cells DMC1 may be formed at intersections of the first conductive line edge regions WL_E1 and WL_E2 and the second conductive lines 160. The second dummy memory cells DMC2 may be spaced apart from each other on the first line isolation insulating layers WIL1 and WIL2 in the second direction (Y direction).

Herein, dummy memory cells may refer to components that are formed together with memory cells whose functionality is needed for operation of a memory device, but that do not themselves provide functionality needed for operation of the memory device. For example, in exemplary embodiments, memory cells are used to store or retrieve data, and dummy memory cells are not used to store or retrieve data. Similarly, dummy conductive lines may refer to components that are formed together with conductive lines whose functionality is needed for operation of a memory device, but that do not themselves provide functionality needed for operation of the memory device. For example, in exemplary embodiments, conductive lines are used to transmit or receive signals, and dummy conductive lines are not used to transmit or receive signals. Other "dummy" components described herein may be understood in a similar manner.

Each of the plurality of memory cells MC may include the variable resistance memory unit 140 for storing information and the switching unit 130 for selecting the memory cell MC. In addition, similar to the plurality of memory cells MC, the plurality of first dummy memory cells DMC1 and the plurality of second dummy memory cells DMC2 may also include the variable resistance memory unit 140 and the switching unit 130.

Each of the plurality of memory cells MC may include the switching unit 130 and the variable resistance memory unit 140 that are sequentially arranged on the plurality of first conductive lines 120. The switching unit 130 may include a first electrode 132, a switching material layer 134, and a second electrode 136, and the variable resistance memory unit 140 may include a variable resistance memory layer 142 and a third electrode 144. Selectively, the variable resistance memory unit 140 may further include a heating electrode disposed between the second electrode 136 and the variable resistance memory layer 142.

In exemplary embodiments, unlike as illustrated in FIG. 4, the variable resistance memory unit 140 and the switching unit 130 may be sequentially arranged on the plurality of first conductive lines 120. For example, the variable resistance memory unit 140 may be on a lower level than the switching unit 130 with respect to the top surface of the substrate 110. In this case, a heating electrode may be further arranged between the variable resistance memory unit 140 and the plurality of first conductive lines 120.

The switching material layer 134 may include a current regulation layer capable of controlling a current flow. The switching material layer 134 may include a material layer in which resistance varies according to a magnitude of a voltage applied across the switching material layer 134. For example, the switching material layer 134 may include a material layer having ovonic threshold switching (OTS) characteristics. When a voltage less than a threshold voltage is applied to the switching material layer 134, the switching material layer 134 may maintain a high resistance state in which no current or almost no current flows, and when a voltage greater than the threshold voltage is applied to the switching material layer 134, the switching material layer 134 may enter a low resistance state and current may start to flow. In addition, when the current flowing through the switching material layer 134 becomes less than a holding current, the switching material layer 134 may be changed to the high resistance state.

The switching material layer 134 may include a chalcogenide material as an OTS material layer. In exemplary embodiments, the switching material layer 134 may include, for example, silicon (Si), tellurium (Te), arsenic (As), germanium (Ge), indium (In), or a combination thereof. For example, the switching material layer 134 may include, by atomic percent, about 14% of Si, about 39% of Te, about 37% of As, about 9% of Ge, and about 1% of In. A percentage ratio may be an atomic percentage ratio in which atomic components are 100% in total, and the same also is applied below. In exemplary embodiments, the switching material layer 134 may include, for example, Si, Te, As, Ge, sulfur (S), Se, or a combination thereof. For example, the switching material layer 134 may include, by atomic percent, about 5% of Si, about 34% of Te, about 28% of As, about 11% of Ge, about 21% of S, and about 1% of Se. In exemplary embodiments, the switching material layer 134 may include, for example, Si, Te, As, Ge, sulfur (S), Se, antimony (Sb), or a combination thereof. For example, the switching material layer 134 may include, by atomic percent, about 21% of Te, about 10% of As, about 15% of Ge, about 2% of S, about 50% of Se, and about 2% of Sb.

However, the switching material layer 134 is not limited to the OTS material layer, and may include various material layers capable of selecting devices. For example, the switching material layer 134 may include a diode, a tunnel junction, a PNP diode or a bipolar junction transistor (BJT), a mixed ionic-electronic conduction (MIEC), etc.

The first electrode 132 and the second electrode 136 may work as current path layers and include a conductive material. For example, the first electrode 132 and the second electrode 136 may include a metal, a conductive metal nitride, a conductive metal oxide, or a combination thereof. Each of the first electrode 132 and the second electrode 136 may include a TiN layer, but are not limited thereto.

In exemplary embodiments, the variable resistance memory layer 142 may include a phase change material that reversibly changes between an amorphous state and a crystalline state according to heating time. For example, the phase of the variable resistance memory layer 142 may be reversibly changed by Joule heat that is generated by voltages applied to both ends of the variable resistance memory layer 142, and may include a material in which resistance is capable of change due to the changed phase. The phase change material may be in the high resistance state in an amorphous phase and in the low resistance state in a crystalline phase. By defining the high resistance state as "0" and the low resistance state as "1", data may be stored in the variable resistance memory layer 142.

In exemplary embodiments, the variable resistance memory layer 142 may include one element or more (a chalcogen element) from Group VI of the periodic table, and may selectively include one chemical modifier or more from Groups III, IV, or V. For example, the variable resistance memory layer 142 may include a material such as $Ge_2Sb_2Te_5$, $Ge_2Sb_2Te_7$, $Ge_1Sb_2Te_4$, and $Ge_1Sb_4Te_7$. In an exemplary embodiment, the variable resistance memory layer 142 may include at least one of Ge—Te, Sb—Te, In—Se, Ga—Sb, In—Sb, As—Te, Al—Te, Bi—Sb—Te (BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, In—Sn—Sb—Te, and As—Ge—Sb—Te, or a combination thereof.

Each element constituting the variable resistance memory layer 142 may have various stoichiometry. Depending on the stoichiometry of each element, crystallization temperature, melting temperature, phase change rate according to crystallization energy, and data retention characteristics of the variable resistance memory layer 142 may be controlled. The variable resistance memory layer 142 may further include impurities of at least one of, for example, carbon (C), nitrogen (N), silicon (Si), oxygen (O), bismuth (Bi), and tin (Sn). A driving current of the memory device 100 may be changed by the impurities. In addition, the variable resistance memory layer 142 may further include at least one metal material of, for example, aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Jr), platinum (Pt), zirconium (Zr), thallium (Tl), lead (Pb), and polonium (Po). The metal material may increase electrical conductivity and thermal conductivity of the variable resistance memory layer 142, and accordingly, may increase a crystallization rate and thus, increase a set speed. In addition, the metal material may improve data retention characteristics of the variable resistance memory layer 142.

The variable resistance memory layer 142 may have a multi-layered structure in which two layers or more having different physical properties from each other are stacked. The number or thicknesses of a plurality of layers may be appropriately selected. A barrier layer, which prevents material diffusion between the plurality of layers, may be further formed between the plurality of layers. In addition, the variable resistance memory layer 142 may have a superlattice structure in which the plurality of layers including different materials from each other are alternately stacked. For example, the variable resistance memory layer 142 may include a structure in which a first layer including Ge—Te and a second layer including Sb—Te are alternately stacked. However, the materials of the first layer and the second layer are not limited thereto, and may include the aforementioned various materials, respectively.

Although the phase change materials have been described as the variable resistance memory layer 142, exemplary embodiments are not limited thereto, and the variable resistance memory layer 142 may include various materials having variable resistance characteristics.

In exemplary embodiments, when the variable resistance memory layer 142 includes a transition metal oxide, the memory device 100 may include resistive random access memory (ReRAM). In the variable resistance memory layer 142 including the transition metal oxide, at least one electrical passage may be generated or eliminated by a program operation. When the electrical passage is generated, the variable resistance memory layer 142 may have a low resistance value, and when the electrical passage is eliminated, the variable resistance memory layer 142 may have a high resistance value. The memory device 100 may store data by using a difference in the low and high resistance values of the variable resistance memory layer 142.

When the variable resistance memory layer 142 includes a transition metal oxide, the transition metal oxide may include at least one metal of, for example, Ta, Zr, Ti, Hf, Mn, Y, Ni, Co, Zn, Nb, Cu, Fe, and Cr. For example, the transition metal oxide may be a single layer or a multiple layer that includes at least one material of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the example materials, x and y may be selected in ranges of about $0 \leq x \leq about$ 1.5 and about $0 \leq y \leq about$ 0.5, respectively, but are not limited thereto.

In exemplary embodiments, when the variable resistance memory layer 142 has a magnetic tunnel junction (MTJ) structure that includes two magnetic electrodes including a magnetic material and a dielectric material disposed between the two magnetic material electrodes, the memory device 100 may constitute magnetic random access memory (MRAM).

Each of the two electrodes may be a magnetization fixed layer or a magnetization free layer, and the dielectric material disposed between the two electrodes may be a tunnel barrier layer. The magnetization fixed layer may have a magnetization direction fixed in one direction, and the magnetization free layer may have a magnetization direction changeable to be parallel or anti-parallel with the magnetization direction of the magnetization fixed layer. Magnetization directions of the magnetization fixed layer and the magnetization free layer may be parallel with one surface of the tunnel barrier layer, but are not limited thereto. Magnetization directions of the magnetization fixed layer and the magnetization free layer may be perpendicular to one surface of the tunnel barrier layer.

When the magnetization direction of the magnetization free layer is parallel with the magnetization direction of the magnetization fixed layer, the variable resistance memory layer 142 may have a first resistance value. When the magnetization direction of the magnetization free layer is anti-parallel with the magnetization direction of the magnetization fixed layer, the variable resistance memory layer 142 may have a second resistance value. The memory device 100 may store data by using the difference in the first and second resistance values. The magnetization direction of the magnetization free layer may be changed by spin torque of electrons in a program current.

The magnetization fixed layer and the magnetization free layer may include a magnetic material. In this case, the magnetization fixed layer may further include an antiferromagnetic material for fixing the magnetization direction of ferromagnetic material in the magnetization fixed layer. The tunnel barrier may include an oxide of any one material of, for example, Mg, Ti, Al, MgZn, and MgB, but is not limited thereto.

The third electrode 144 may work as a current path layer and include a conductive material. For example, the third electrode 144 may include a metal, a conductive metal nitride, a conductive metal oxide, or a combination thereof. In exemplary embodiments, the third electrode 144 may include a conductive material capable of generating sufficient heat to cause a phase change in the variable resistance memory layer 142. For example, the third electrode 144 may include any one of a high melting point metal, a nitride thereof, or a carbon-based conductive material, for example, any one of TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, WON, TaON, C, SiC, SiCN, CN, TiCN, and TaCN, or a combination thereof. However, the material of the third electrode 144 is not limited thereto. In exemplary embodiments, the third electrode 144 may include a conductive layer including, for example, a metal, a conductive metal nitride, or a conductive metal oxide, and at least one conductive barrier layer covering at least a portion of the conductive layer. The conductive barrier layer may include, for example, a metal oxide, a metal nitride, or a combination thereof, but is not limited thereto.

A lower insulating layer 112 may be disposed between the substrate 110 and the plurality of first conductive lines 120. The lower insulating layer 112 may include an insulating material such as, for example, silicon oxide, silicon nitride, and silicon oxynitride. A first insulating layer 122 filling a space between the plurality of first conductive lines 120 may be disposed on the lower insulating layer 112, and a second insulating layer 152 may surround sidewalls of the plurality of memory cells MC, the plurality of first dummy memory cells DMC1, and the plurality of second dummy memory cells DMC2. For example, the first insulating layer 122 may be disposed between the plurality of first conductive lines 120. A top surface of the first insulating layer 122 may be disposed on an identical level as a top surface of the first line isolation insulating layers WIL1 and WIL2. For example, the top surface of the first insulating layer 122 and the top surface of the first line isolation insulating layers WIL1 and WIL2 may be substantially aligned with each other. For example, the top surface of the first insulating layer 122 and the top surface of the first line isolation insulating layers WIL1 and WIL2 may be substantially coplanar. The first insulating layer 122 may be integrally formed with the first line isolation insulating layers WIL1 and WIL2. Third insulating layers 162 filling a space between the plurality of second conductive lines 160 may be disposed on the second insulating layer 152. In exemplary embodiments, the first insulating layer 122, the second insulating layer 152, and the third insulating layer 162 may include an insulating material such as, for example, silicon oxide, silicon nitride, and silicon oxynitride. In exemplary embodiments, at least one of the first insulating layer 122, the second insulating layer 152, and the third insulating layer 162 may include an air space and an insulating material layer surrounding the air space.

In exemplary embodiments, the plurality of second dummy memory cells DMC2 formed in the dummy cell region DCR are not electrically connected to the plurality of memory cells MC formed in the memory cell region MCR. Since the plurality of second dummy memory cells DMC2 are disposed on the first line isolation insulating layers WIL1 and WIL2, even when a voltage is applied to the plurality of the second conductive lines 160 corresponding to the plurality of second dummy memory cells DMC2 (for example, the second dummy conductive lines (DB3 and DB6)), the plurality of second dummy memory cells DMC2 do not operate as normal memory cells.

In addition, in exemplary embodiments, some of the plurality of first dummy memory cells DMC1 disposed in the dummy cell region DCR are not electrically connected to the plurality of memory cells MC formed in the memory cell region MCR. Since the first conductive line edge regions WL_E1 and WL_E2 are spaced apart from the first conductive line main region WL_M, the plurality of first dummy memory cells DMC1 disposed in the first conductive line edge regions WL_E1 and WL_E2 are not electrically connected to the plurality of memory cells MC. Thus, even when a voltage is applied to the plurality of memory cells MC via the plurality of first conductive lines 120 and the plurality of second conductive lines 160, the plurality of first dummy memory cells DMC1 may maintain a floating state.

In a general cross point-type memory device according to a comparative example, a plurality of memory cells may be formed at intersections of a plurality of bit lines and a plurality of word lines. Accordingly, when there is a defective memory cell, all the memory cells in one column connected to the defective memory cell via the bit line, or all the memory cells in one row connected to the defective memory cell via the word line, may be affected. For example, in a process of patterning the plurality of bit lines, there may be an issue that the switching unit is damaged by etching at the edge portion of the memory cell block due to a height difference between the center portion and the edge portion of the memory cell block (including the memory cell region and the dummy cell region). Also, in a process of patterning the memory cell, there may be issues that the switching unit at the edge portion of the memory cell block is over-etched and thus, etched together with a portion of the word line under the switching unit, and the metal material of the word line is re-deposited on the sidewalls of the switching unit and thus, an electrical short occurs between two memory cells. A failure of the memory cell connected to a corresponding word line or a corresponding bit line due to a defective or an electrical short in the edge portion may be referred to as a bridge failure.

In contrast, according to exemplary embodiments, as illustrated in FIG. 3, even though a defective cell DMC_O is formed at the edge of the memory cell block (or in the dummy cell region DCR) and the switching unit SWU of the defective cell DMC_O is turned on, since a first conductive line edge region WL_E1 connected to the defective cell DMC_O is spaced apart from the first conductive line main region WL_M, an electrical path is not provided to the memory cell region MCR via the plurality of first conductive lines 120.

In conclusion, according to the memory device 100 according to exemplary embodiments described above, even when in the process of patterning the plurality of second conductive lines 160, should the switching unit SWU be damaged and turned on or an electrical short occur therein due to, for example, a relatively high level difference in the edge portion of the dummy cell region DCR, the memory cell MC in the memory cell region MCR may operate normally without being affected by this malfunction. Therefore, a bridge failure in the cross point structure may be prevented, and the memory device 100 thus may have excellent reliability.

Figure 7:
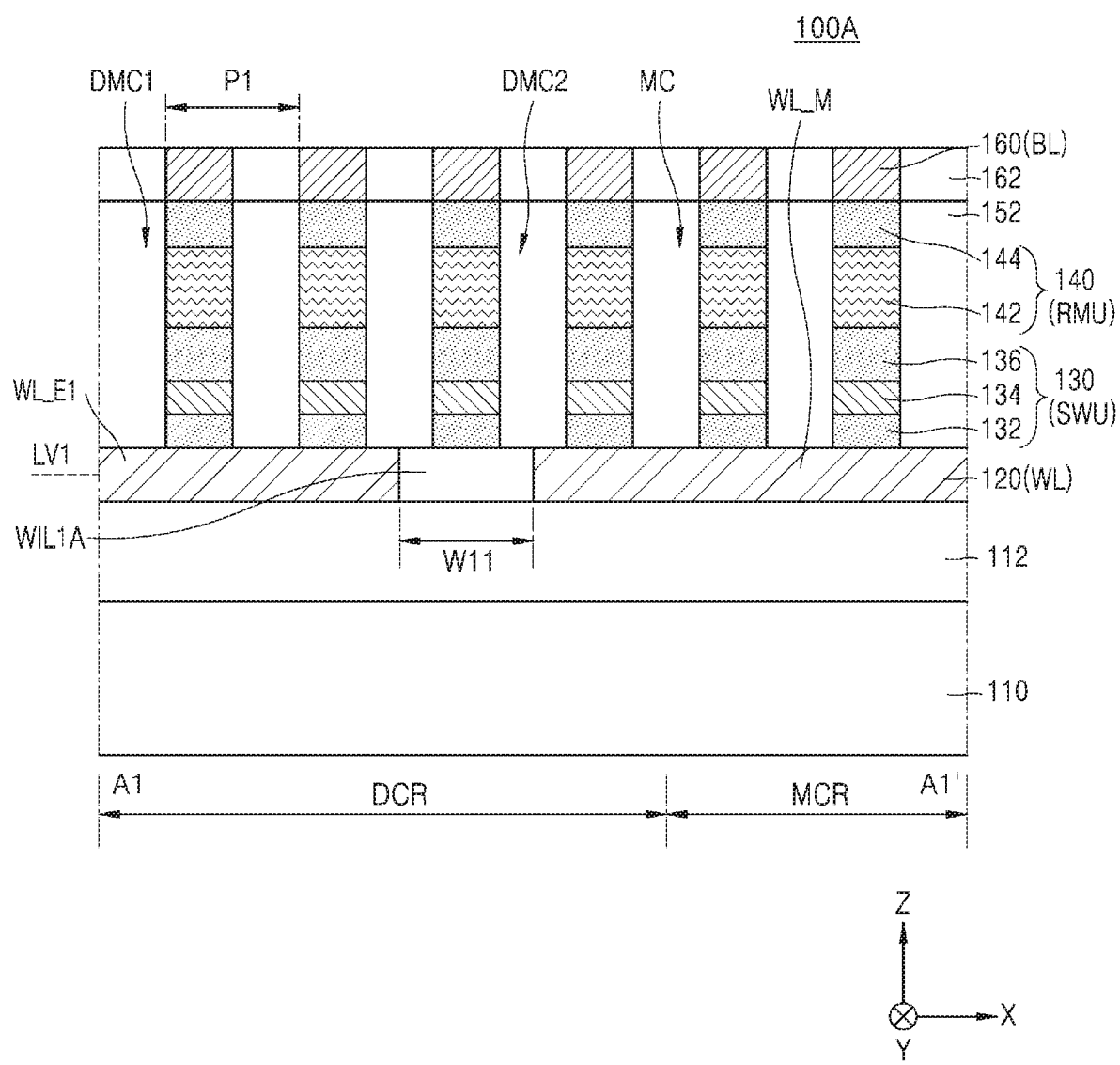
FIG. 7 is a cross-sectional view of a memory device according to exemplary embodiments.
Figure 8:
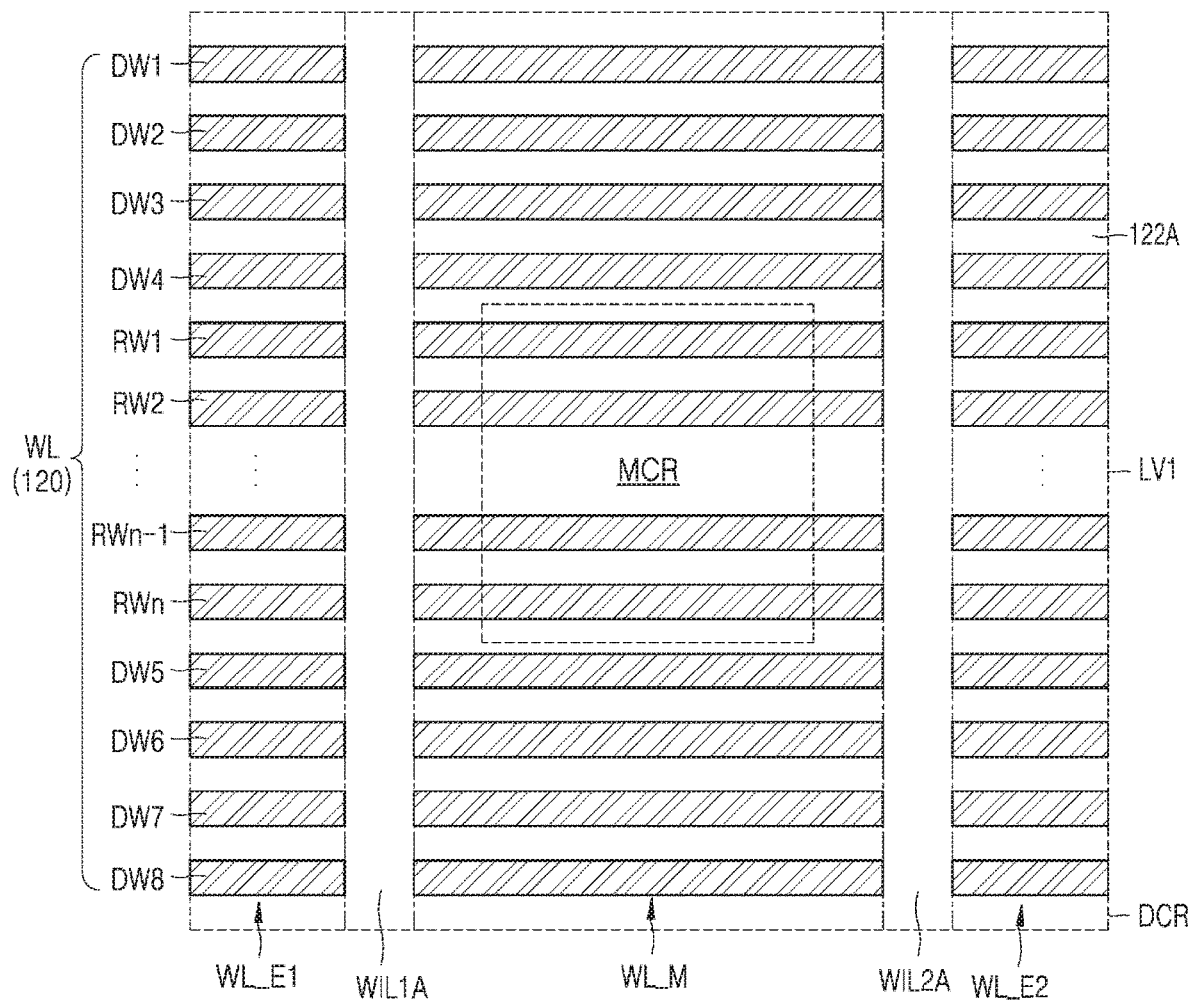
FIG. 8 is a horizontal cross-sectional view taken at a first level LV1 in FIG. 7.

FIG. 7 is a cross-sectional view illustrating a memory device 100A according to exemplary embodiments. FIG. 8 is a horizontal cross-sectional view taken at a first level in FIG. 7. FIG. 7 is a cross-sectional view of a region corresponding to the line AI-AI' in FIG. 2B. In FIGS. 7 and 8, the same reference numerals as those in FIGS. 1 through 6 may denote the same components, and a further description of components and technical aspects previously described may be omitted.

Referring to FIGS. 7 and 8, first line isolation insulating layers WIL1A and WIL2A may include the same material layer as a first insulating layer 122A. For example, the first insulating layer 122A may fill the space between the plurality of first conductive lines 120 and extend in the first direction (X direction), and the first line isolation insulating layers WIL1A and WIL2A may fill a space between the first conductive line main region WL_M and the first conductive line edge regions WL_E1 and WL_E2 and extend in the second direction (Y direction).

The first line isolation insulating layers WIL1A and WIL2A may have the first width W11 in the first direction (X direction), and the first width W11 may be about 100% to about 300% of the first pitch P1 of the plurality of second conductive lines 160.

In an example manufacturing process, a second mask layer 320 (refer to FIGS. 25A and 25B) including openings 320H2 may be formed, and the plurality of first conductive lines 120 may be formed by using the second mask layer 320. Next, the first line isolation insulating layers WIL1A and WIL2A and the first insulating layer 122A may be simultaneously formed by filling a space between a region corresponding to the opening 320H2 and the plurality of first conductive lines 120 with an insulating material. When a double patterning method is used to form the second mask layer 320, since about 100% of the first pitch P1 may correspond to the minimum width that is realized by using the photolithography patterning, the first width W11 may be about 100% or more of the first pitch P1. Alternatively, when the first width W11 is greater than about 300% of the first pitch P1, due to a relatively large height difference between the memory cell region MCR and the dummy cell region DCR, process difficulty may increase in a process for patterning the switching unit 130 and the variable resistance memory unit 140 on the first conductive line 120.

According to the memory device 100A described above, even when, in the process of patterning the plurality of second conductive lines 160, the switching unit 130 in the dummy cell region DCR is damaged and turned on or an electrical short occurs due to a relatively high level difference of the edge portion of the dummy cell region DCR, the memory cell MC in the memory cell region MCR may normally operate without being affected by the malfunction. Accordingly, a bridge failure in the cross point structure may be prevented, and the memory device 100A may thus have excellent reliability.

Figure 9:
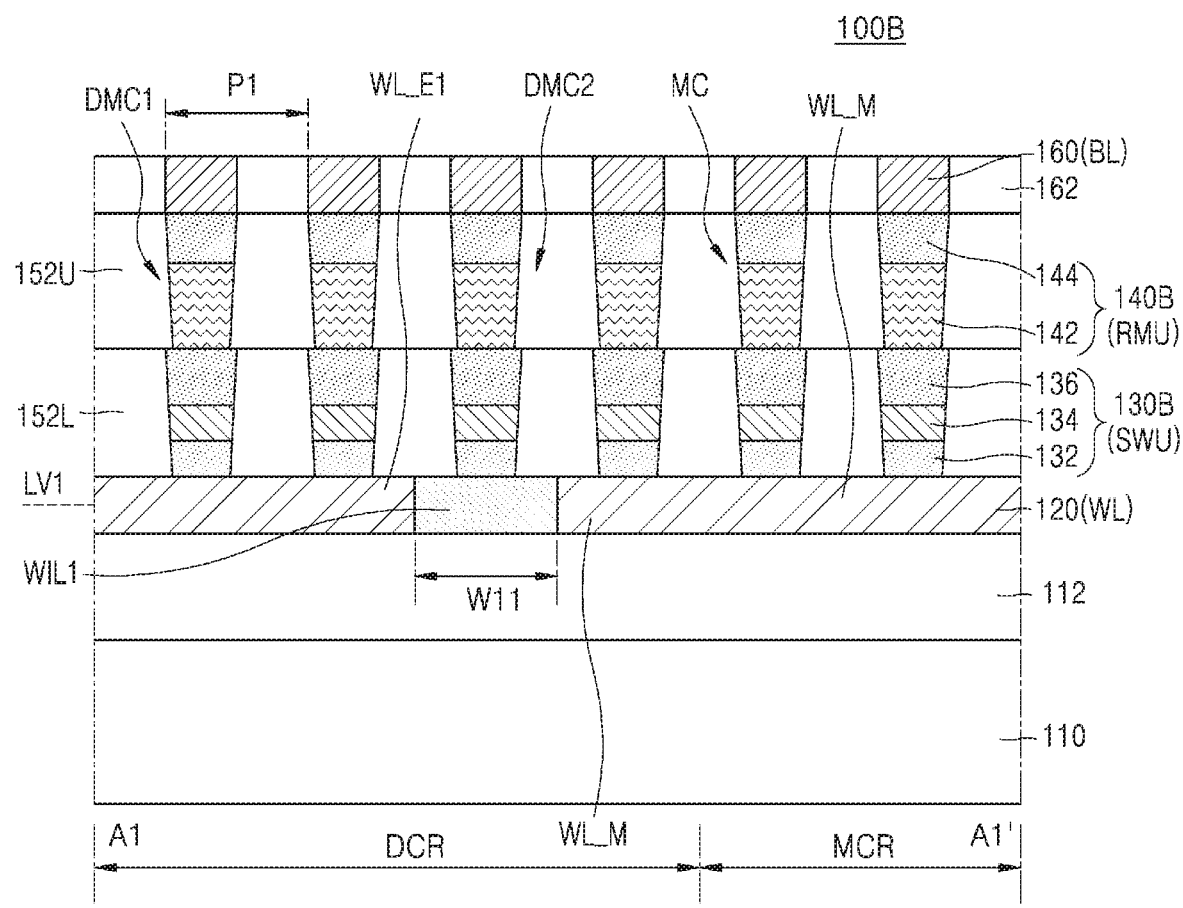
FIG. 9 is a cross-sectional view of a memory device according to exemplary embodiments.

FIG. 9 is a cross-sectional view illustrating a memory device 100B according to exemplary embodiments. FIG. 9 is a cross-sectional view of a region corresponding to the line AI-AI' in FIG. 2B. In FIG. 9, the same reference numerals as those in FIGS. 1 through 8 may denote the same components, and a further description of components and technical aspects previously described may be omitted.

Referring to FIG. 9, a switching unit 130B and a variable resistance memory unit 140B may be formed by a damascene method. For example, the switching unit 130B may be surrounded by a lower mold layer 152L, and a width at a top surface of the switching unit 130B may be slightly greater than a width at a bottom surface of the switching unit 130B. For example, the switching unit 130B may be slightly tapered inward in a direction toward the substrate 110. In addition, the variable resistance memory unit 140B may be surrounded by an upper mold layer 152U, and a width at a top surface of the variable resistance memory unit 140B may be slightly greater than a width at a bottom surface of the variable resistance memory unit 140B. For example, the variable resistance memory unit 140B may be slightly tapered inward in a direction toward the substrate 110.

In an example manufacturing process, the switching unit 130B may be formed by forming the lower mold layer 152L including a plurality of openings, sequentially filling the first electrode 132, the switching material layer 134, and the second electrode 136 in the openings of the lower mold layer 152L, and removing unnecessary material layers formed on the top surface of the lower mold layer 152L by, for example, a chemical mechanical polishing (CMP) process, etc. Similarly, the variable resistance memory unit 140B may be formed by forming the upper mold layer 152U including a plurality of openings, sequentially filling the variable resistance memory layer 142 and the third electrode 144 in the openings of the upper mold layer 152U, and removing unnecessary material layers formed on the top surface of the upper mold layer 152U using, for example, the CMP process etc.

In general, when a CMP process is performed to form a cross point-type structure, a switching unit may be excessively etched at an edge portion of a memory cell block due to a height difference between the center portion and the edge portion of the memory cell block, and as a result, etching damage may occur in the switching unit. Also, in a bit line patterning process, an electrical short between two bit lines may occur due to re-deposition of a conductive material between the bit lines adjacent to the edge portion of the memory cell block.

However, according to the memory device 100B according to exemplary embodiments, even when the switching unit 130B in the dummy cell region DCR is damaged and turned on or an electrical short occurs, the memory cell MC in the memory cell region MCR may normally work without being affected by the malfunction. Accordingly, a bridge failure in the cross point structure may be prevented, and the memory device 100B may thus have excellent reliability.

Figure 10:
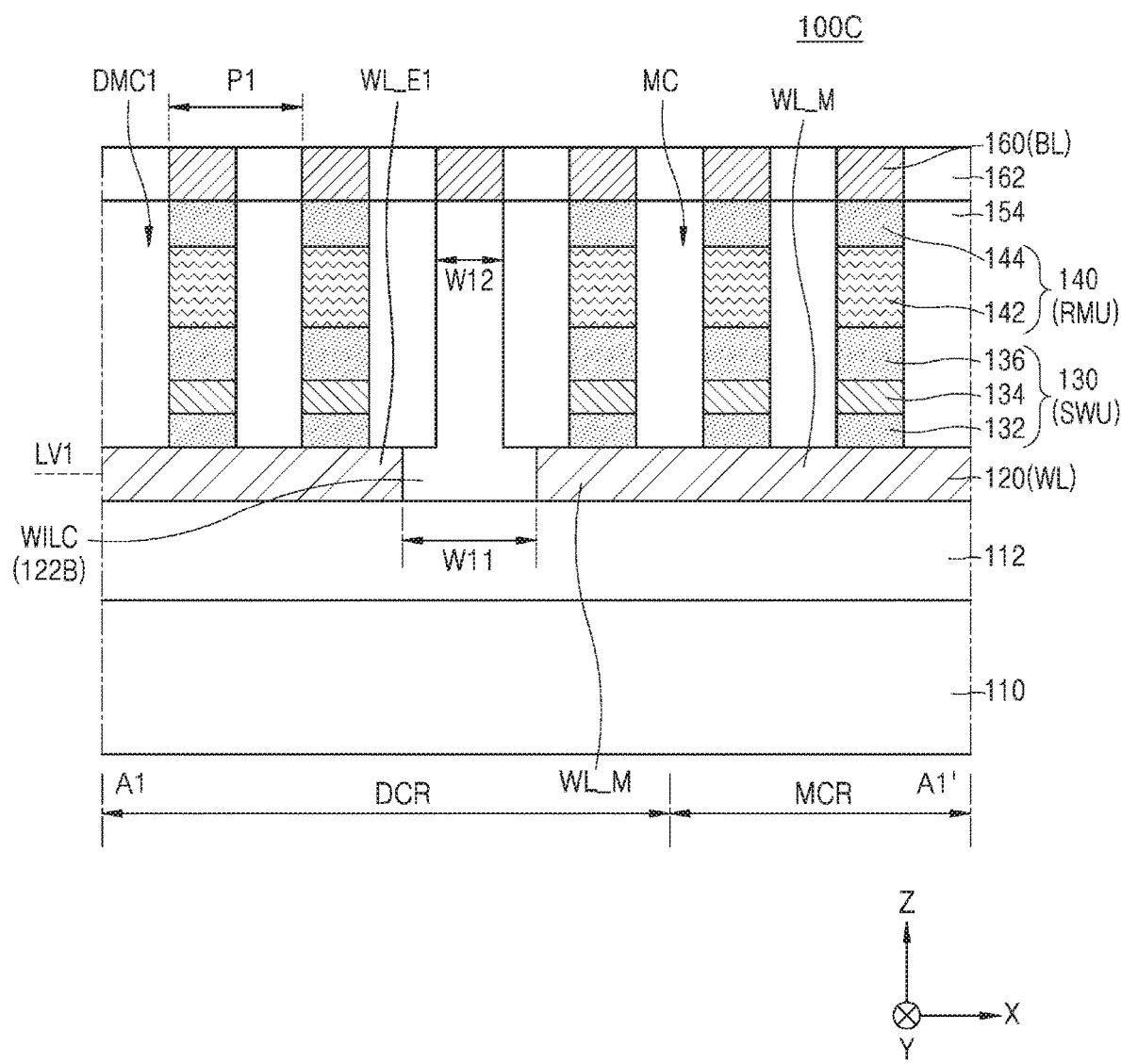
FIG. 10 is a cross-sectional view of a memory device according to exemplary embodiments.

FIG. 10 is a cross-sectional view illustrating a memory device 100C according to exemplary embodiments. FIG. 10 is a cross-sectional view of a region corresponding to the line AI-AI' in FIG. 2B. In FIG. 10, the same reference numerals as those in FIGS. 1 through 9 may denote the same components, and a further description of components and technical aspects previously described may be omitted.

Referring to FIG. 10, a first line isolation insulating layer WILC may be disposed between the first conductive line main region WL_M and the first conductive line edge region WL_E1, and may be surrounded by a second insulating layer 154. Sidewalls of the first line isolation insulating layer WILC may be aligned with sidewalls of the corresponding second conductive lines 160, and a top side width W12 of the first line isolation insulation layer WILC may be the same as the widths of the switching unit 130 and the variable resistance memory unit 140. In addition, the top side width W12 of the first line isolation insulating layer WILC may be less than the bottom side width W11 thereof.

The first line isolation insulating layer WILC may have the top surface at the same level as the top surface of the plurality of memory cells MC (or the first dummy memory cells DMC1), and the first line isolation insulating layer WILC may have the bottom surface at the same level as the bottom surface of the plurality of first conductive lines 120. For example, the top surface of the first line isolation insulating layer WILC may be substantially coplanar (e.g., substantially aligned) with the top surface of the plurality of memory cells MC (or the first dummy memory cells DMC1), and the bottom surface of the first line isolation insulating layer WILC and the bottom surface of the plurality of first conductive lines 120 may be substantially coplanar (e.g., substantially aligned with each other). The plurality of second conductive lines 160 corresponding to the first line isolation insulating layer WILC may be arranged directly on the top surface of the first line isolation insulating layer WILC. Accordingly, in exemplary embodiments, the second dummy memory cell DMC2 (refer to FIG. 4) may be omitted between the first line isolation insulating layer WILC and the plurality of second conductive lines 160.

According to an example manufacturing process, after a first conductive layer 120L (refer to FIG. 28A) for forming the plurality of first conductive lines 120 is first formed, a first material layer stack 130S and a second material layer stack 140S for forming the switching unit 130 and the variable resistance memory unit 140 may be formed, respectively. Next, while the first conductive layer 120L, the first material layer stack 130S, and the second material layer stack 140S are simultaneously patterned in a line shape by using an additional third mask layer 330 (refer to FIGS. 28A and 28B), an opening WLH (refer to FIG. 29A) extending in the second direction (Y direction) may be formed. A first insulating layer 122B and the first line isolation insulating layer WILC may be formed in a space between line-shaped patterns and inside the opening WLH. Next, a second conductive layer 160L for forming the second conductive line 160 is formed, and the second conductive layer 160L, the first material layer stack 130S, and the second material layer stack 140S may be simultaneously patterned in a line shape. In the process of patterning, the top side portion of the first line isolation insulating layer WILC may be further removed, and the first line separation insulation layer WILC having the top side width less than the bottom side width may be formed.

Figure 11:
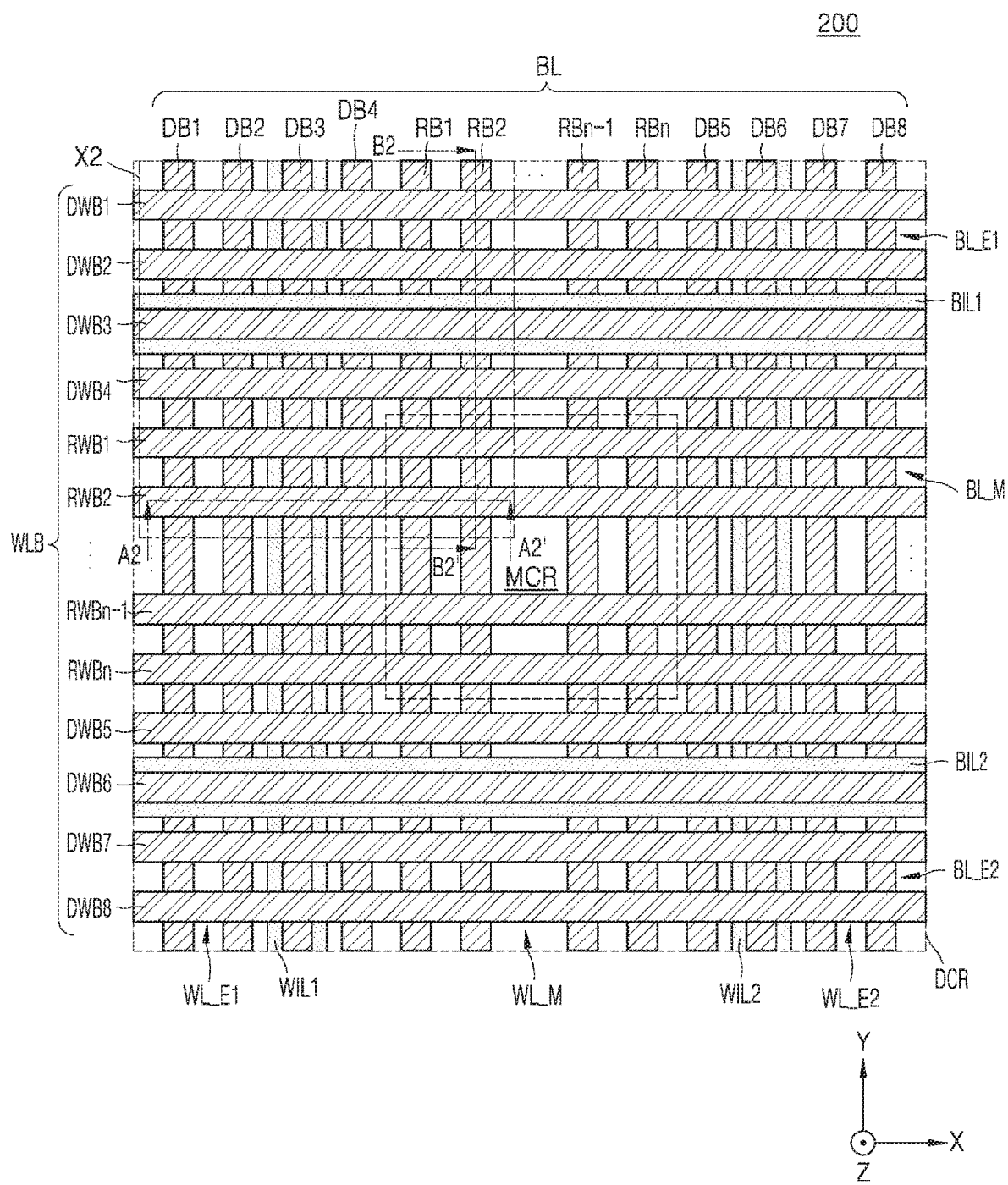
FIG. 11 is a layout diagram of a memory device according to exemplary embodiments.
Figure 12:
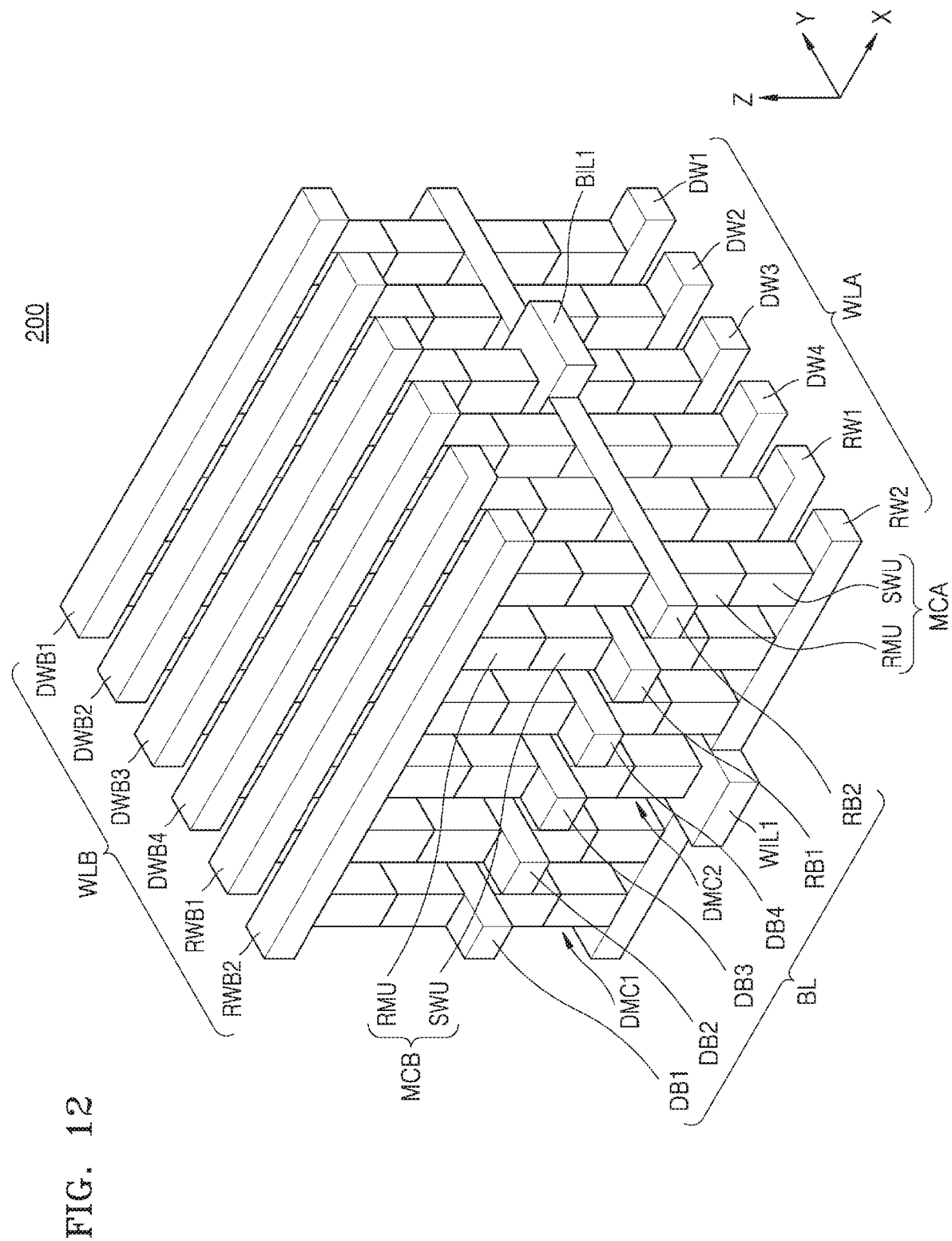
FIG. 12 is a schematic perspective view of a portion X2 in FIG. 11.
Figure 13:
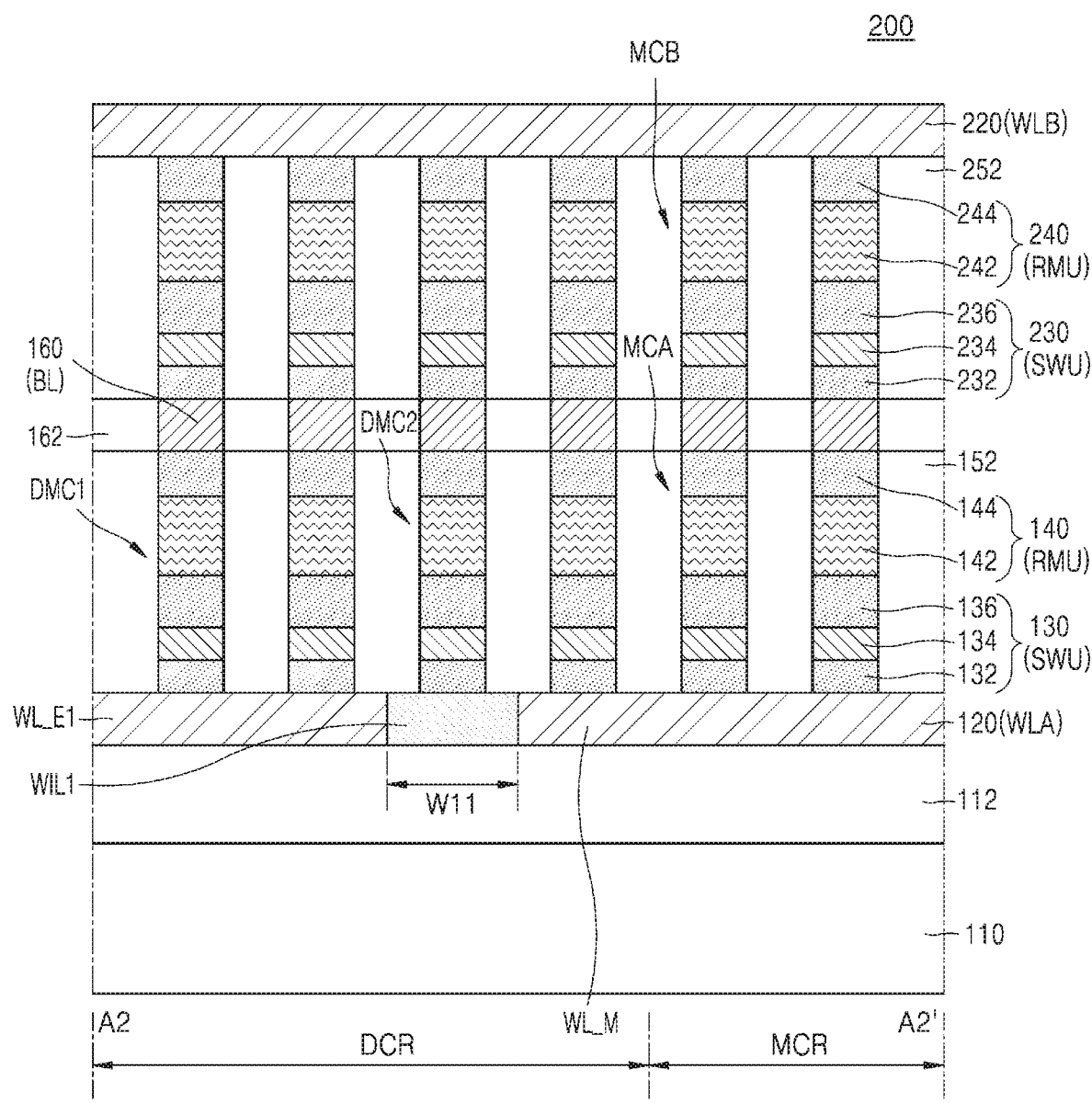
FIG. 13 is a cross-sectional view taken along line A2-A2' in FIG. 11.
Figure 14:
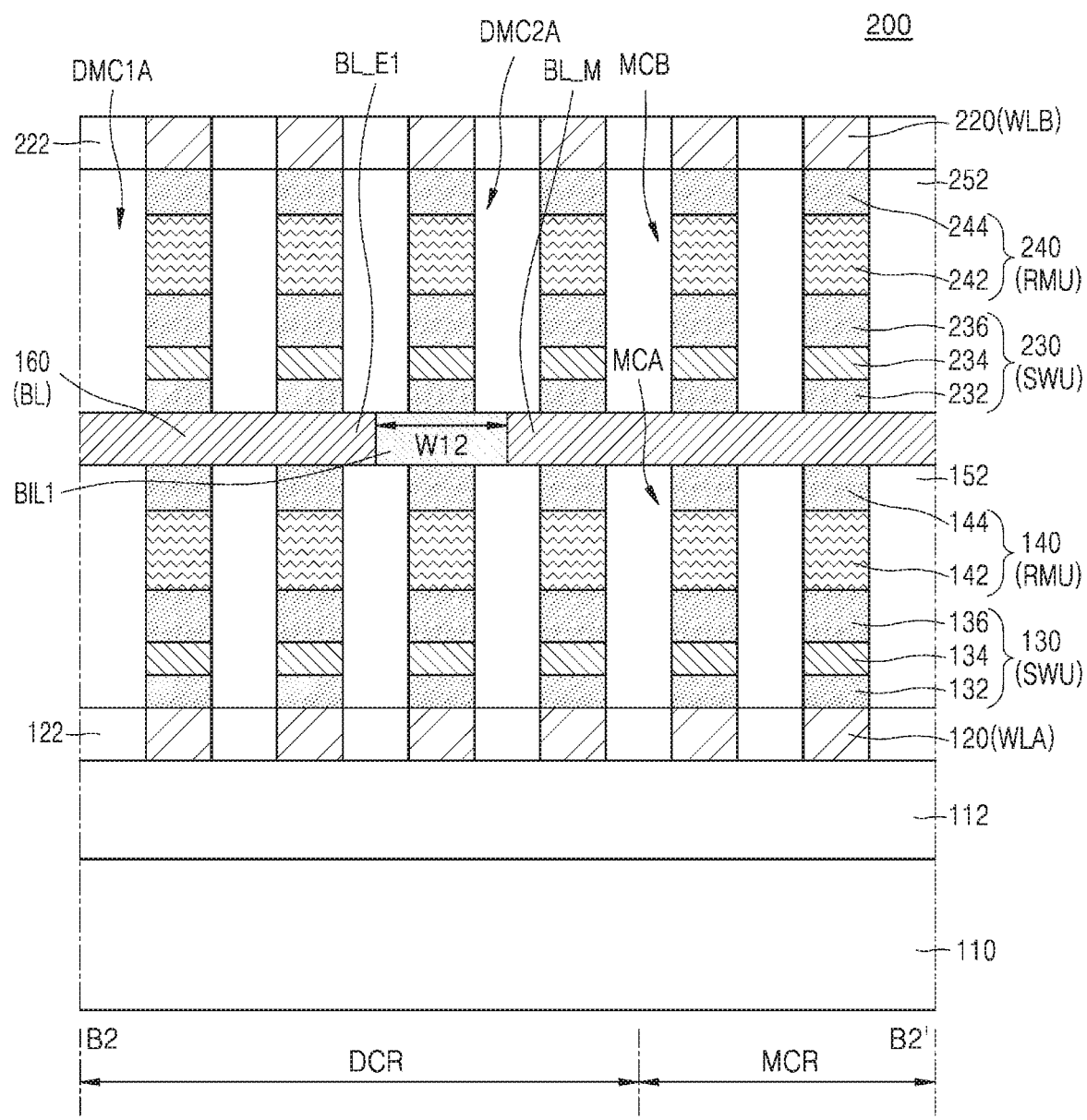
FIG. 14 is a cross-sectional view taken along line B2-B2' in FIG. 11.
Figure 14:
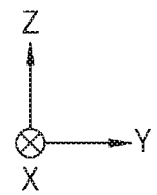

FIG. 11 is a layout diagram of a memory device 200 according to exemplary embodiments. FIG. 12 is a schematic perspective view of a portion X2 portion in FIG. 11. FIG. 13 is a cross-sectional view taken along line A2-A2' in FIG. 11. FIG. 14 is a cross-sectional view taken along line B2-B2' in FIG. 11. In FIGS. 11 through 14, the same reference numerals as those in FIGS. 1 through 10 may denote the same components, and a further description of components and technical aspects previously described may be omitted.

Referring to FIGS. 11 through 14, the memory device 200 may include a plurality of first conductive lines 120 (corresponding to a plurality of first word lines WLA) disposed on the substrate 110 and extending in the first direction (X direction), a plurality of second conductive lines 160 (corresponding to a plurality of bit lines BL) disposed on the substrate 110 and extending in the second direction (Y direction), and a plurality of third conductive lines 220 (corresponding to a plurality of second word lines WLB) disposed on the substrate and extending in the first direction (X direction).

The plurality of first conductive lines 120 and the plurality of second conductive lines 160 may have similar characteristics to those described with reference to FIGS. 2A through 6. The plurality of first conductive lines 120 may include the first dummy conductive lines DW1 through DW8 (refer to FIG. 2B) and the first normal conductive lines RW1, RW2, . . . RWn-1, and RWn (refer to FIG. 2B).

As shown in FIG. 12, the plurality of third conductive lines 220 may include third dummy conductive lines DWB1 through DWB8 and third normal conductive lines RWB1, RWB2, . . . , RWBn-1, and RWBn. For example, four third dummy conductive lines DWB1, DWB2, DWB3, and DWB4 may be on one side of the third normal conductive lines RWB1, RWB2, . . . , RWBn-1, and RWBn, and the other four second dummy conductive lines DWB5, DWB6, DWB7, and DWB8 may be on the other side of the third normal conductive lines RWB1, RWB2, . . . , RWBn-1, and RWBn.

In a plan view, the plurality of memory cells MCA may be at locations where the plurality of first conductive lines 120 intersect the plurality of second conductive lines 160, and a plurality of memory cells MCB may be at locations where the plurality of second conductive lines 160 intersect the plurality of third conductive lines 220. The plurality of second conductive lines 160 may function as a common bit line for both the plurality of memory cells MCA and the plurality of memory cells MCB.

Each of the plurality of memory cells MCB may include a switching unit 230 and a variable resistance memory unit 240. The switching unit 230 may include a first electrode 232, a switching material layer 234, and a second electrode 236, and the variable resistance memory unit 240 may include a variable resistance memory layer 242 and a third electrode 244. The plurality of memory cells MCA and the plurality of memory cells MCB may have similar characteristics to the plurality of memory cells MC described with reference to FIGS. 2A through 6. In addition, the plurality of memory cells MCB may be surrounded by a fourth insulating layer 252, and a space between the plurality of third conductive lines 220 may be filled by a fifth insulating layer 222.

Each of the plurality of second conductive lines 160 may include the second conductive line main region BL_M and the second conductive line edge regions BL_E1 and BL_E2 that are spaced apart from each other and are in a straight line in the second direction (Y direction). For example, one second conductive line edge region BL_E1 and another second conductive line edge region BL_E2 may be disposed on opposite sides of the second conductive line main region BL_M. The second conductive line edge regions BL_E1 and BL_E2 may be disposed in the dummy cell region DCR.

Second line isolation insulating layers BIL1 and BIL2 may extend in the second direction (Y direction) between the second conductive line main region BL_M and the second conductive line edge regions BL_E1 and BL_E2. The second line isolation insulating layers BIL1 and BIL2 may electrically insulate and physically separate the second conductive line edge regions BL_E1 and BL_E2 from the second conductive line main region BL_M. The second line isolation insulating layers BIL1 and BIL2 may have a top surface on the same level as a top surface of each of the plurality of second conductive lines 160. For example, in exemplary embodiments, the top surface of the second line isolation insulating layers BIL1 and BIL2 and the top surface of each of the plurality of second conductive lines 160 may be substantially coplanar (e.g., substantially aligned with each other). In addition, in an exemplary embodiment, the second line isolation insulating layers BIL1 and BIL2 may have a bottom surface at the same level as a bottom surface of each of the plurality of second conductive lines 160. In an exemplary embodiment, the bottom surface of the second line isolation insulating layers BIL1 and BIL2 may be at a lower level than the bottom surface of each of the plurality of second conductive lines 160.

As illustrated in FIG. 14, the second line isolation insulating layer BIL1 may have a second width W12 in the second direction (Y direction), and the second width W12 may be about 100% to about 300% of the first pitch P1 of the second conductive line 160. In an exemplary embodiment, similar to the second line isolation insulating layer BIL1, the second line isolation insulating layer BIL2 may have the second width W12.

In the dummy cell region DCR, a plurality of third dummy memory cells DMC1A may be disposed between the plurality of second conductive lines 160 and the plurality of third conductive lines 220 (or at intersection locations of the plurality of second conductive lines 160 and the plurality of third conductive lines 220 in a plan view), and a plurality of fourth dummy memory cells DMC2A may be spaced apart from each other in the first direction (X direction) between the second line isolation insulating layers BIL1 and BIL2 and the third conductive lines 220 corresponding thereto.

In exemplary embodiments, the plurality of first dummy memory cells DMC1 and the plurality of third dummy memory cells DMC1A formed in the dummy cell region DCR are not electrically connected to the plurality of memory cell regions (MCA and MCB). Since the plurality of fourth dummy memory cells DMC2A is disposed on the second line isolation insulating layers BIL1 and BIL2, even when a voltage is applied to the plurality of the third conductive lines 220 corresponding to the plurality of fourth dummy memory cells DMC2A (for example, the third dummy conductive lines (DWB3 and DWB6)), the plurality of fourth dummy memory cells DMC2A do not operate as normal memory cells.

In addition, in exemplary embodiments, some of the plurality of third dummy memory cells DMC1A in the dummy cell region DCR are not electrically connected to the plurality of memory cells MCB formed in the memory cell region MCR. Since the second conductive line edge regions BL_E1 and BL_E2 are spaced apart from the second conductive line main region BL_M, the plurality of third dummy memory cells DMC1A on the second conductive line edge regions BL_E1 and BL_E2 are not electrically connected to the plurality of memory cells MCB. Thus, even when a voltage is applied to the plurality of memory cells MCB via the plurality of second conductive lines 160 and the plurality of third conductive lines 220, the plurality of third dummy memory cells DMC1A may maintain a floating state.

According to the memory device 200 described above, even when, in the process of patterning the plurality of third conductive lines 220, the switching unit 230 in the dummy cell region DCR is damaged and turned on or an electrical short occurs due to a relatively high level difference of the edge portion of the dummy cell region DCR, the memory cell MCB in the memory cell region MCR may normally operate without being affected by the malfunction. Therefore, a bridge failure in the cross point structure may be prevented, and the memory device 200 may thus have excellent reliability.

Figure 15:
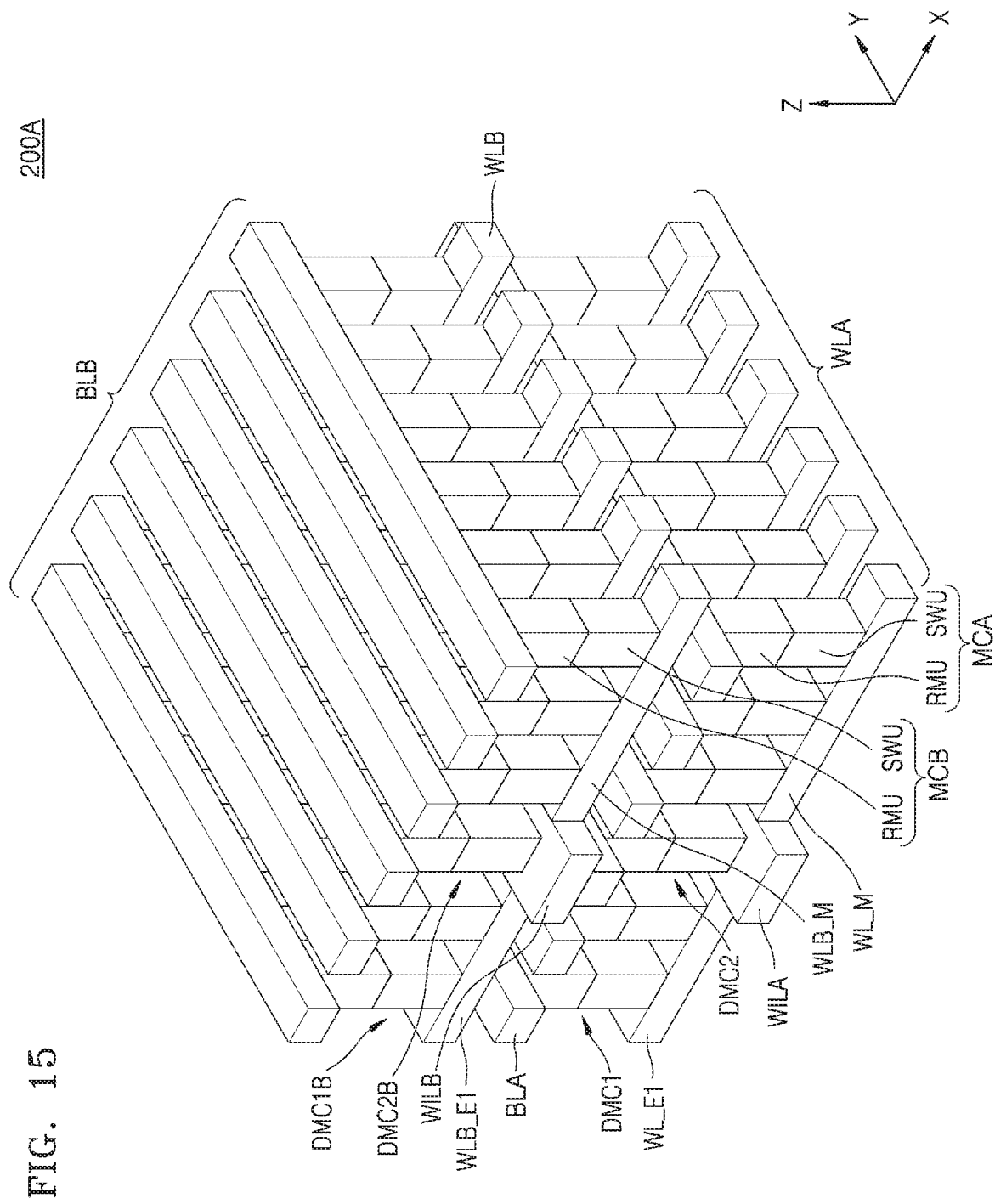
FIG. 15 is a perspective view of a memory device according to exemplary embodiments.
Figure 16:
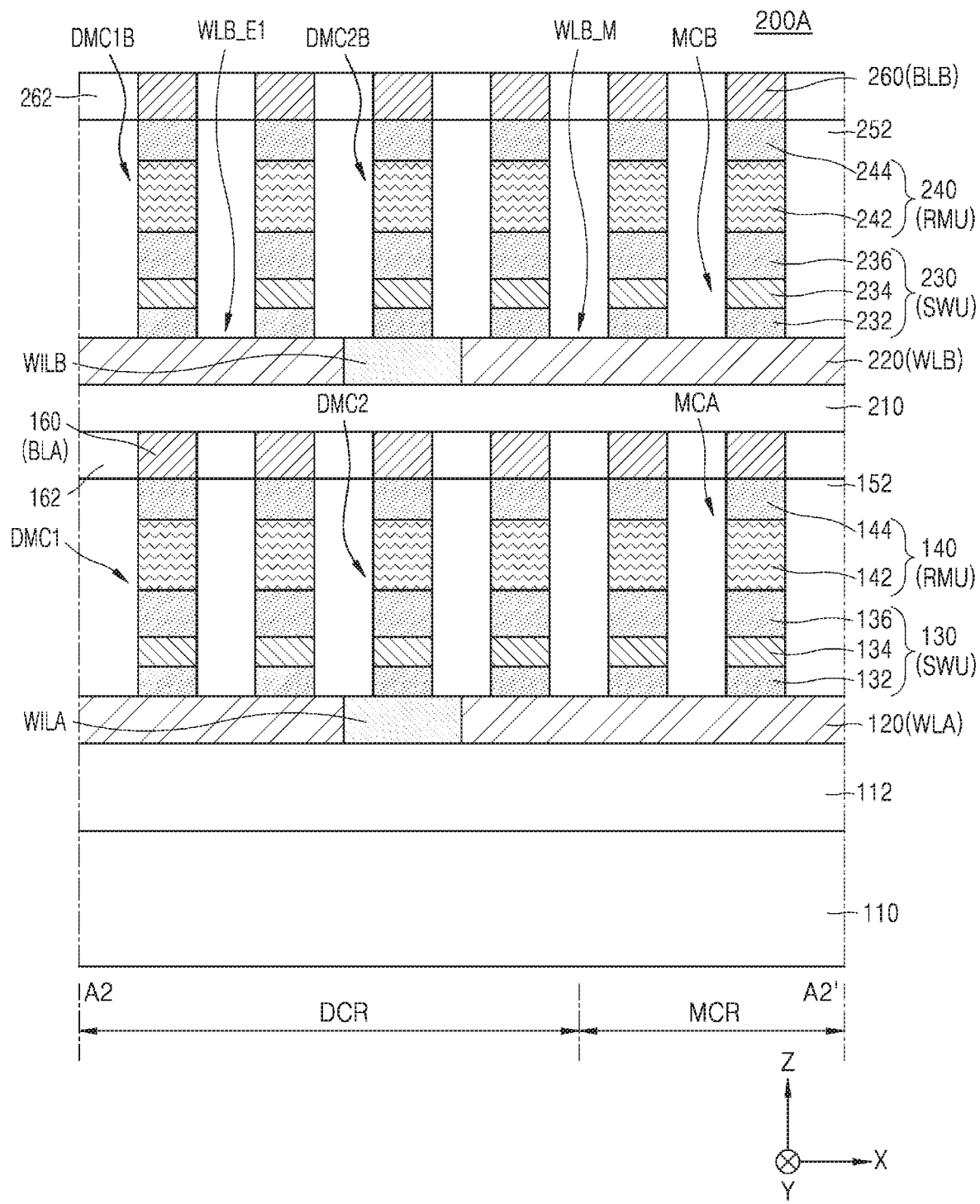
FIGS. 16 and 17 are cross-sectional views of the memory device of FIG. 15.
Figure 17:
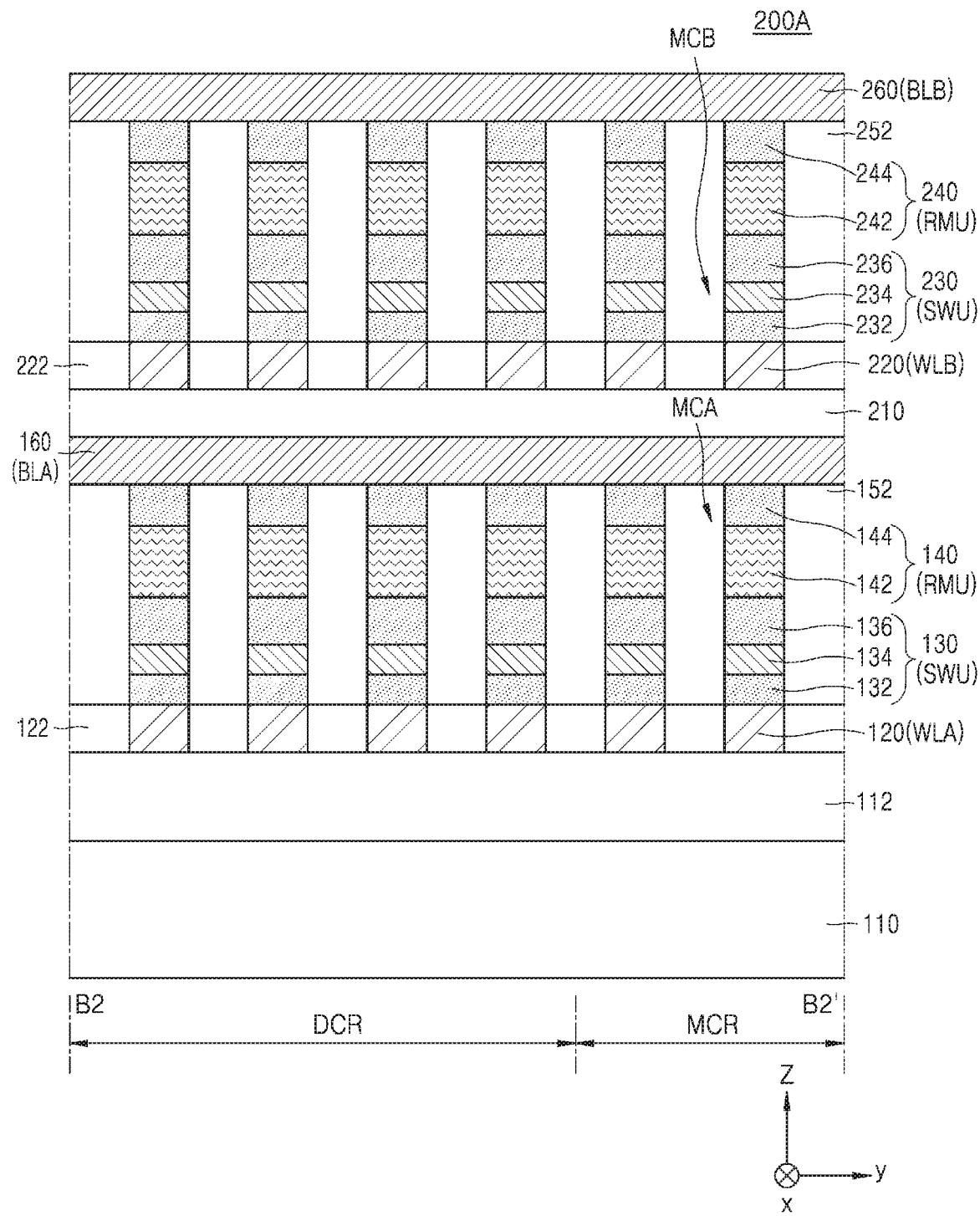

FIG. 15 is a perspective view illustrating a memory device 200A according to exemplary embodiments. FIGS. 16 and 17 are cross-sectional views illustrating the memory device 200A of FIG. 15. FIG. 16 is a cross-sectional view corresponding to a cross section taken along line A2-A2' in FIG. 11. FIG. 14 is a cross-sectional view corresponding to a cross section taken along line B2-B2' in FIG. 11. In FIGS. 15 through 17, the same reference numerals as those in FIGS. 1 through 14 may denote the same components, and a further description of components and technical aspects previously described may be omitted.

Referring to FIGS. 15 through 17, the memory device 200A may include a plurality of first conductive lines 120 (corresponding to a plurality of first word lines WLA) disposed on the substrate 110 and extending in the first direction (X direction), a plurality of second conductive lines 160 (corresponding to a plurality of first bit lines BLA) disposed on the substrate 110 and extending in the second direction (Y direction), a plurality of third conductive lines 220 (corresponding to a plurality of second word lines WLB) disposed on the substrate 110 and extending in the first direction (X direction), and a plurality of fourth conductive lines 260 (corresponding to a plurality of second bit lines BLB) disposed on the substrate 110.

In a plan view, the plurality of memory cells MCA may be at locations where the plurality of first conductive lines 120 intersect the plurality of second conductive lines 160, and the plurality of memory cells MCB may be at locations where the plurality of third conductive lines 220 intersect the plurality of fourth conductive lines 260.

Each of the plurality of third conductive lines 220 may include a third conductive line main region WLB_M and a third conductive line edge region WLB_E1 that are apart from each other and arranged in a straight line in the first direction (X direction). The third conductive line edge region WLB_E1 may be disposed in the dummy cell region DCR. A second line isolation insulating layer WILB may extend in the second direction (Y direction) between the third conductive line main region WLB_M and the third conductive line edge region WLB_E1. The second line isolation insulating layer WILB may vertically overlap the first line isolation insulating layer WILA, but is not limited thereto. In exemplary embodiments, the top surface of the second line isolation insulating layer WILB and the top surface of each of the plurality of third conductive lines 220 may be substantially coplanar (e.g., substantially aligned with each other).

In the dummy cell region DCR, the plurality of third dummy memory cells DMC1B may be disposed between the plurality of third conductive lines 220 and the plurality of fourth conductive lines 260, and a plurality of fourth dummy memory cells DMC2B may be disposed between the second line isolation insulating layer WILB and the fourth conductive lines 260 corresponding thereto.

In addition, a sixth insulating layer 210 may be disposed between the plurality of second conductive lines 160 and the plurality of third conductive lines 220, and a space between the plurality of fourth conductive lines 260 may be filled by a seventh insulating layer 262.

Figure 18:
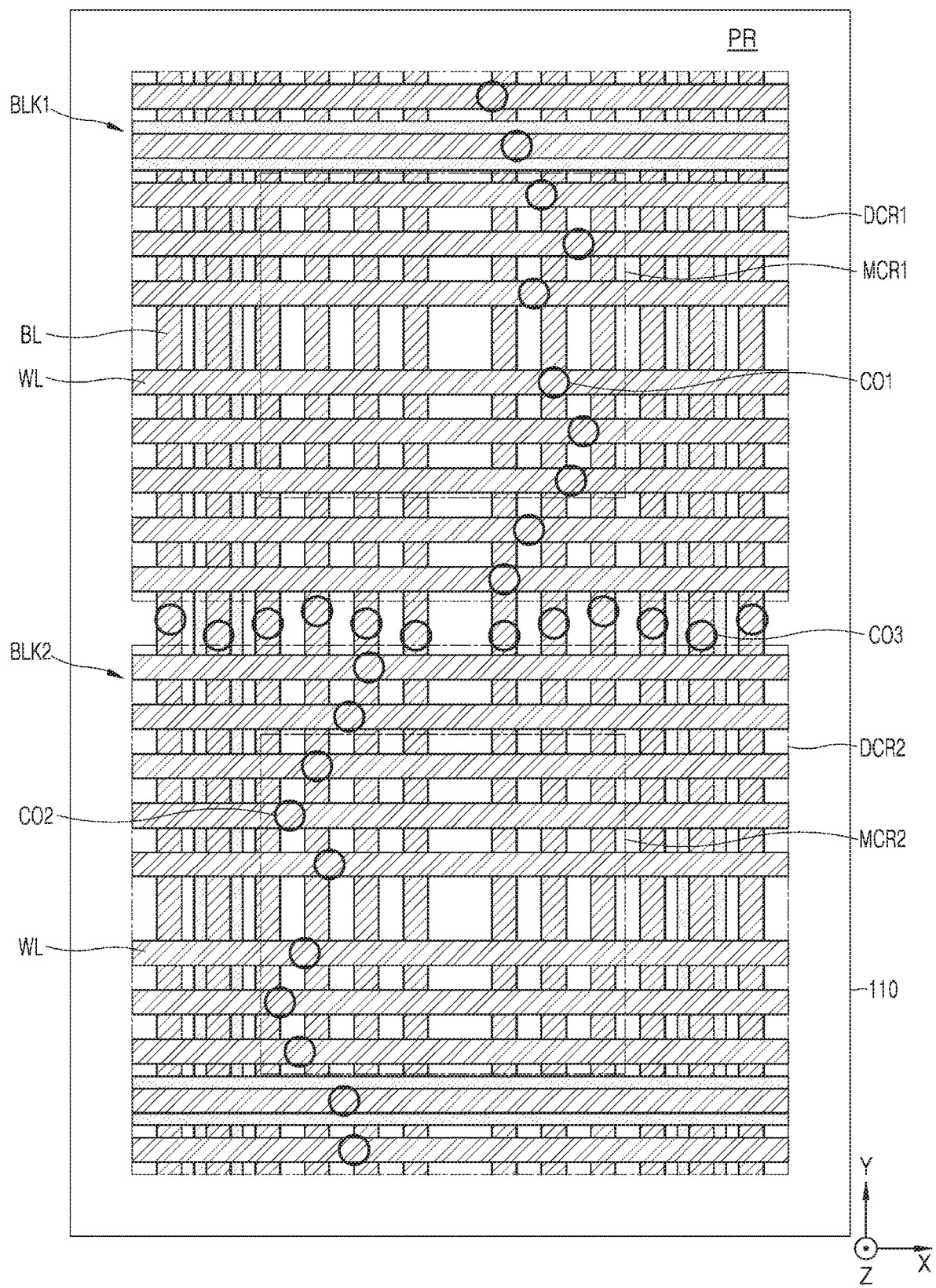
FIG. 18 is a schematic diagram of a memory device according to exemplary embodiments.

FIG. 18 is a schematic diagram illustrating a memory device 200B according to exemplary embodiments.

Referring to FIG. 18, the memory device 200B may include a first memory cell block BLK1 and a second memory cell block BLK2 disposed on the substrate 110. The substrate 110 may include a first memory cell region MCR1 and a second memory cell region MCR2, a first dummy cell region DCR1, a second dummy cell region DCR2, and the peripheral circuit region PR. The first memory cell block BLK1 may be disposed in the first memory cell region MCR1 and the first dummy cell area DCR1, and the second memory cell block BLK2 may be disposed in the second memory cell area MCR2 and the second dummy cell region DCR2. Each of the first memory cell block BLK1 and the second memory cell block BLK2 may include at least one of the memory devices 100, 100A, 100B, 100C, 200, and 200A described above with reference to FIGS. 1 through 17.

A first contact CO1 may be disposed on the plurality of first word lines WL of the first memory cell block BLK1, and a second contact CO2 may be disposed on the plurality of first word lines WL of the second memory cell block BLK2. In addition, the first memory cell block BLK1 and the second memory cell block BLK2 may share the plurality of first bit lines BL, and a third contact CO3 may be disposed on the plurality of first bit lines BL.

FIGS. 19A through 24B are cross-sectional views illustrating a method of manufacturing the memory device 100 according to exemplary embodiments.

Figure 19A:
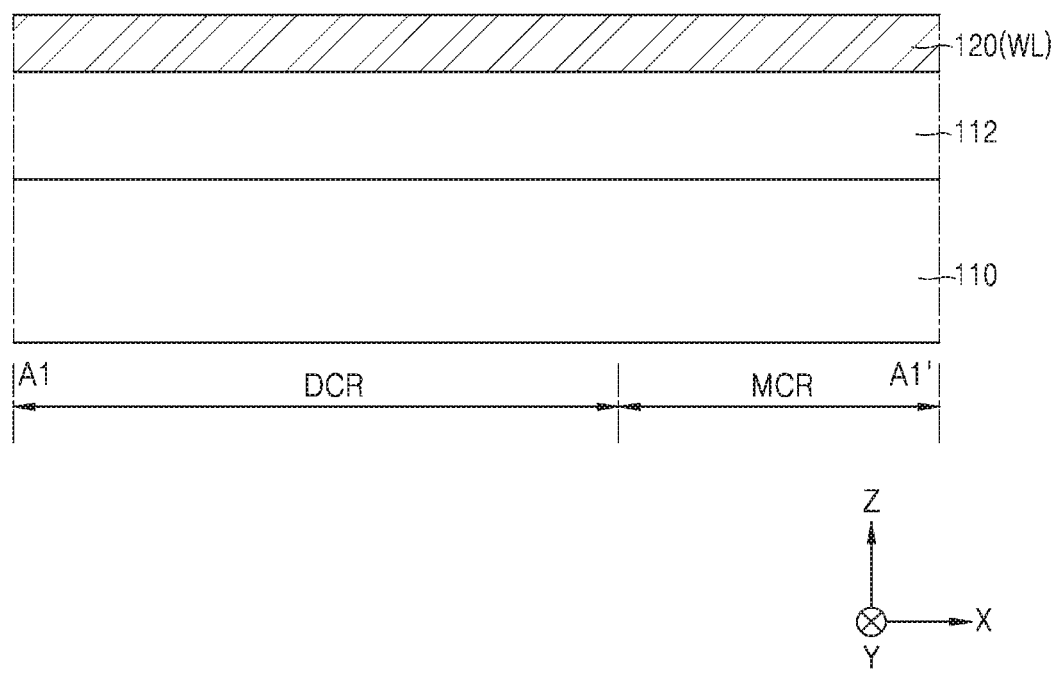
FIGS. 19A through 24B are cross-sectional views illustrating a method of manufacturing a memory device according to exemplary embodiments.
Figure 19B:
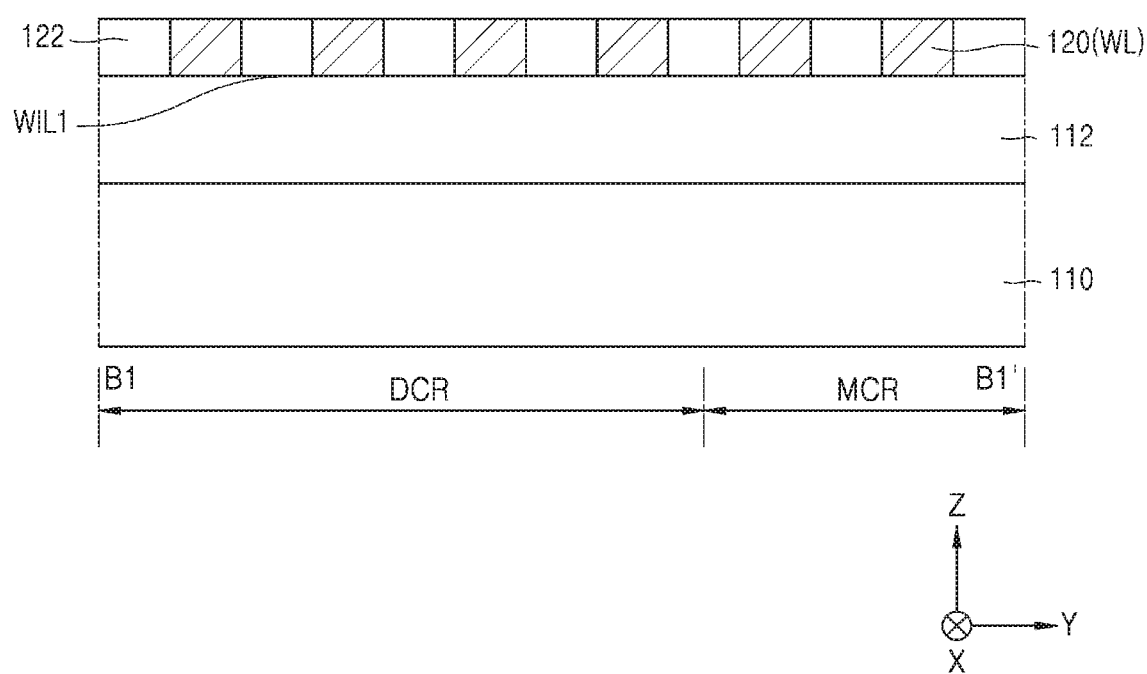

Referring to FIGS. 19A and 19B, the lower insulating layer 112 may be formed on the substrate 110. The plurality of first conductive lines 120 may be formed by forming a first conductive layer on the lower insulating layer 112 and patterning the first conductive layer. Next, the first insulating layer 122 may be formed by forming an insulating layer on the plurality of first conductive lines 120 and the lower insulating layer 112, and planarizing upper surfaces of the insulating layer until the plurality of first conductive lines 120 are exposed.

In exemplary embodiments, a hard mask may be formed by using a double patterning method to form the plurality of first conductive lines 120, and the first conductive lines 120 may be patterned by using the hard mask, but the method is not limited thereto.

Figure 20:
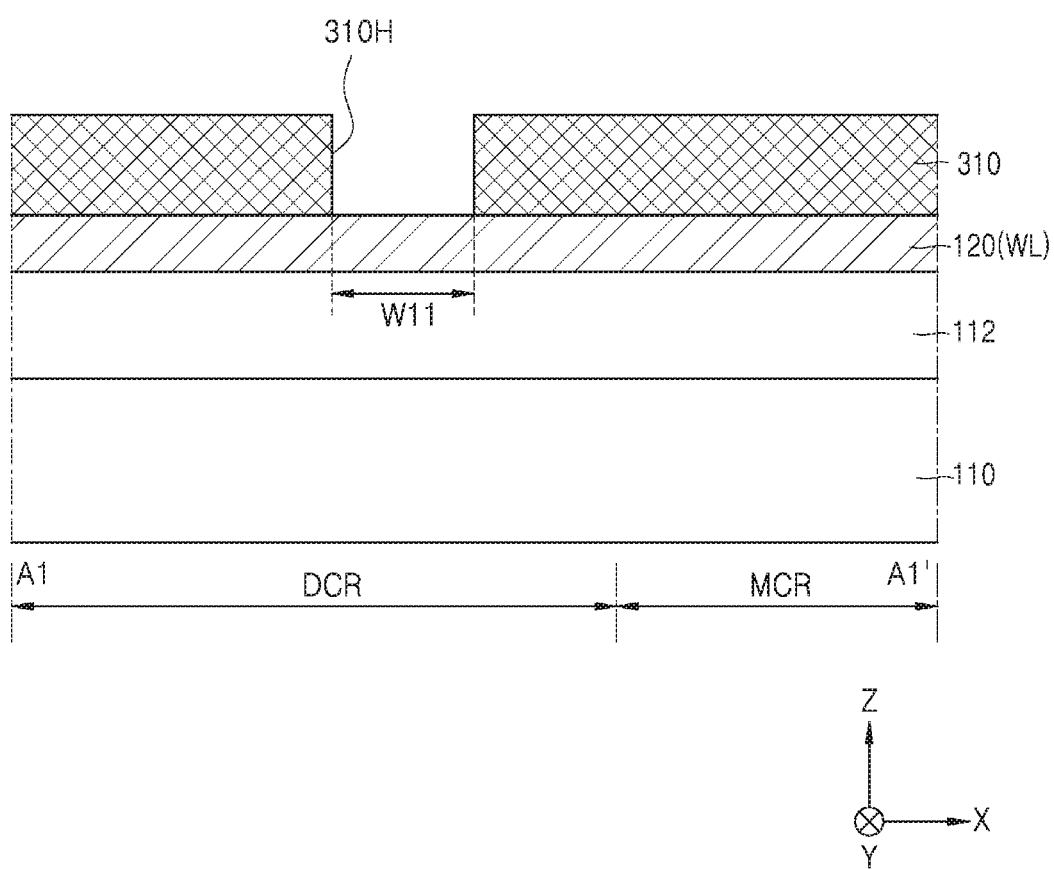

Referring to FIG. 20, a first mask layer 310 including an opening 310H may be formed on the plurality of first conductive lines 120 and the first insulating layer 122 (refer to FIG. 19B). For example, the opening 310H may have a line shape extending in the second direction (Y direction). The opening 310H may have the first width W11 in the second direction (Y direction), and the first width W11 may be about 100% to about 300% of the minimum pitch of the line pattern that is implemented by using the double patterning method (or of the first pitch P1 of the plurality of second conductive lines 160 (refer to FIG. 4)).

Selectively, the first mask layer 310 may expose a portion of the edge regions of the plurality of first conductive lines 120, and accordingly, may be used as a trimming mask for trimming the edge portions of the plurality of first conductive lines 120, which is formed by using the double patterning method.

Figure 21:
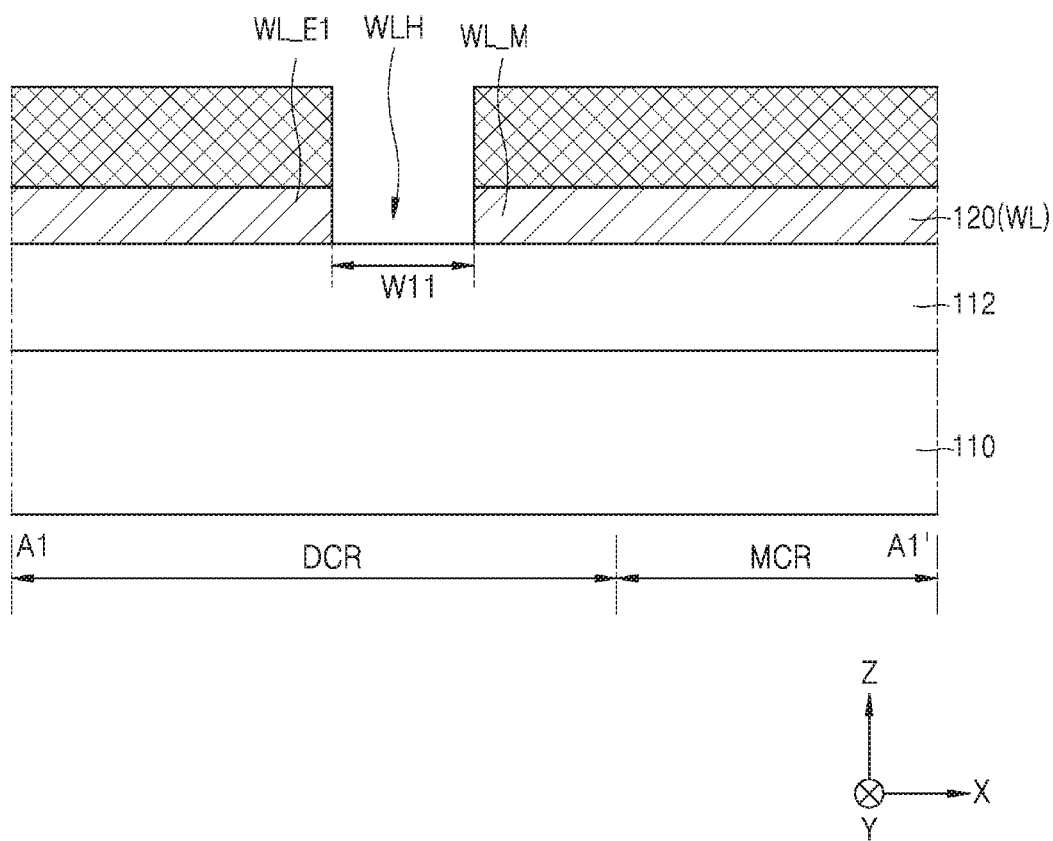

Referring to FIG. 21, by removing portions of the first conductive line 120 and the first insulating layer 122 (refer to FIG. 19B) by using the first mask layer 310 as an etch mask, the opening WLH may be formed and the top surface of the lower insulating layer 112 may be exposed. The edge portions of the first conductive lines 120 may be trimmed together by using the first mask layer 310 as described above.

As the opening WLH is formed, each of the plurality of first conductive lines 120 may be separated into the first conductive line main region WL_M and the first conductive line edge region WL_E1.

Figure 22:
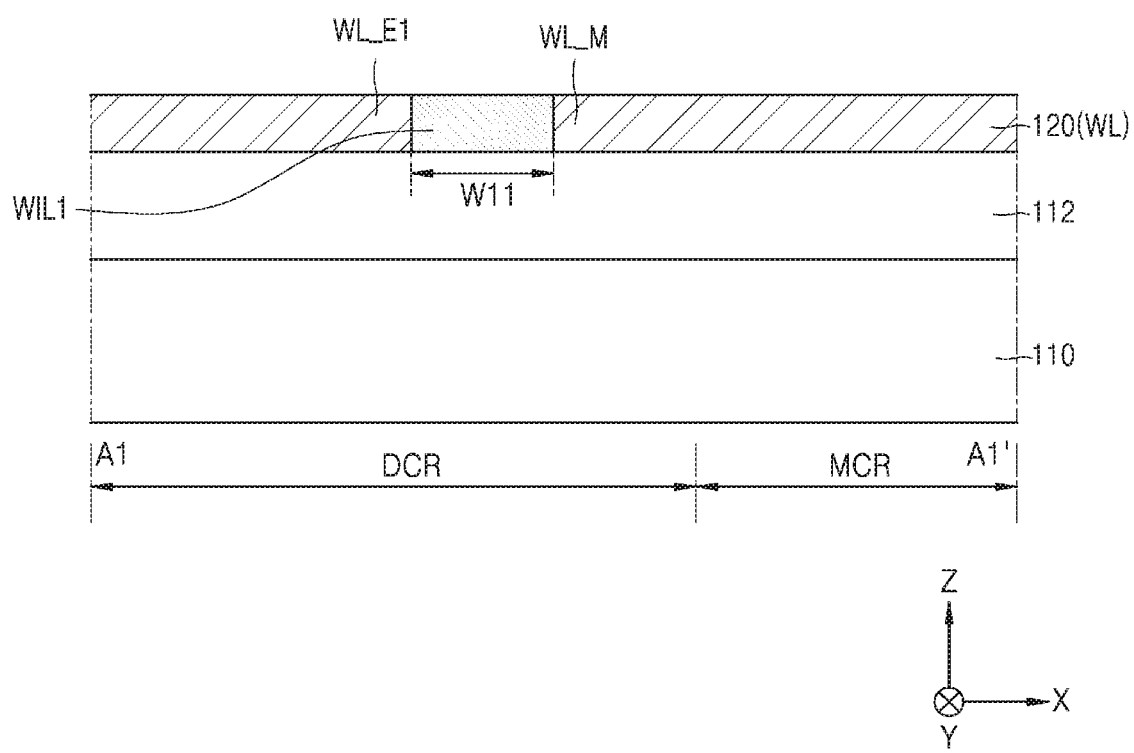

Referring to FIG. 22, the opening WLH may be filled with an insulating material on the plurality of first conductive lines 120, and by planarizing or etching an upper portion of the insulating material until the top surfaces of the plurality of first conductive lines 120 are exposed, the first line isolation insulating layer WIL1 may be formed.

Figure 23A:
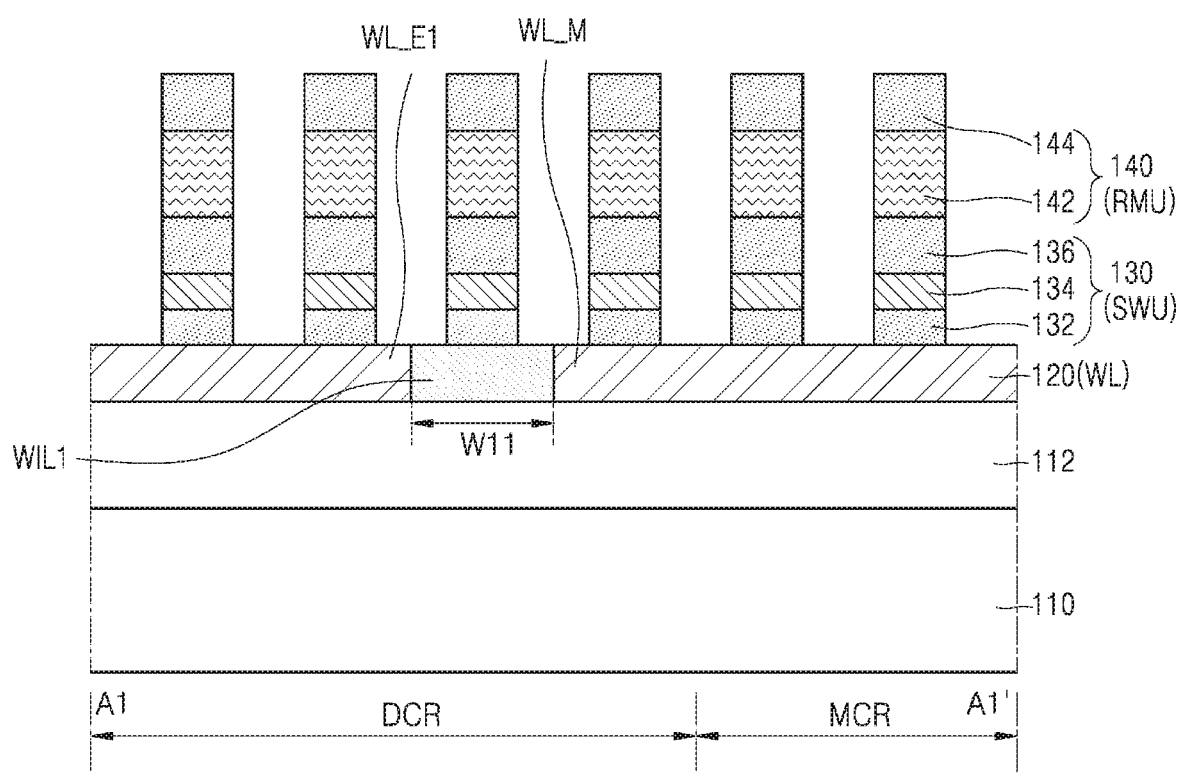
Figure 23B:
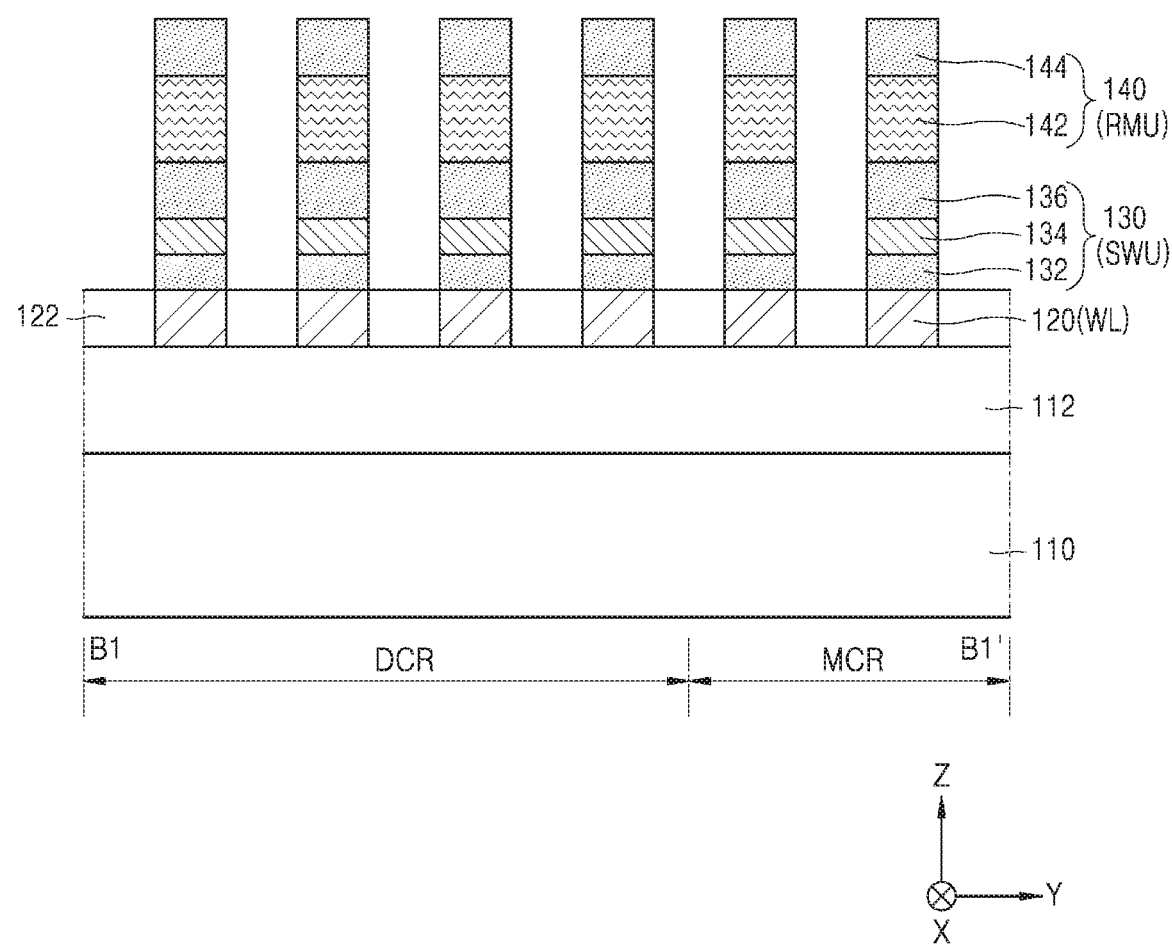

Referring to FIGS. 23A and 23B, by sequentially forming a first electrode material layer, a preliminary switching material layer, a second electrode material layer, a variable resistance material layer, and a third electrode material layer on the plurality of first conductive lines 120, and patterning the material layers, the switching unit 130 including the first electrode 132, the switching material layer 134, and the second electrode 136, and the variable resistance memory unit 140 including the variable resistance memory layer 142 and the third electrode 144, may be formed.

In exemplary embodiments, by forming an island-type mask layer on the material layers, and patterning the material layers by using the mask layer as an etch mask, the switching unit 130 and the variable resistance memory unit 140 may be formed.

In exemplary embodiments, by first forming and patterning the first electrode material layer, the preliminary switching material layer, and the second electrode material layer, the switching unit 130 may be formed first, and thereafter, by forming and patterning the variable resistance material layer and the third electrode material layer, the variable resistance memory unit 140 may be formed.

In exemplary embodiments, by sequentially forming the first electrode material layer, the preliminary switching material layer, the second electrode material layer, the variable resistance material layer, and the third electrode material layer, and next, first forming the variable resistance memory unit 140 by first patterning the variable resistance material layer and the third electrode, and then, patterning the first electrode material layer, the preliminary switching material layer, and the second electrode material layer, the switching unit 130 may be formed. Selectively, before the switching unit 130 is formed, a process for forming a liner on the sidewalls of the variable resistance memory unit 140 may be further performed.

In exemplary embodiments, by sequentially forming the first electrode material layer, the preliminary switching material layer, the second electrode material layer, the variable resistance material layer, and the third electrode material layer, patterning the material layers extending in a line shape in the Y direction, and thereafter, patterning the material layers in the X direction, the material layers may have a plurality of island shapes.

Figure 24A:
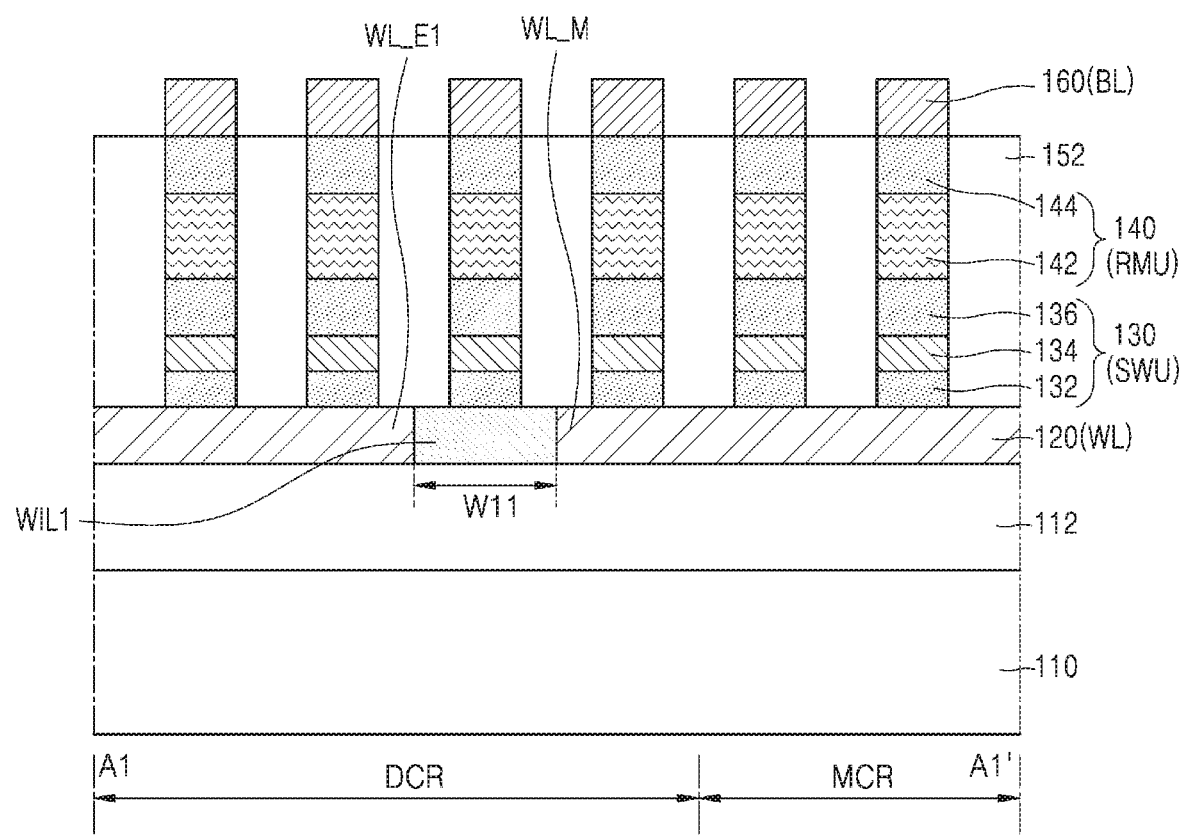
Figure 24B:
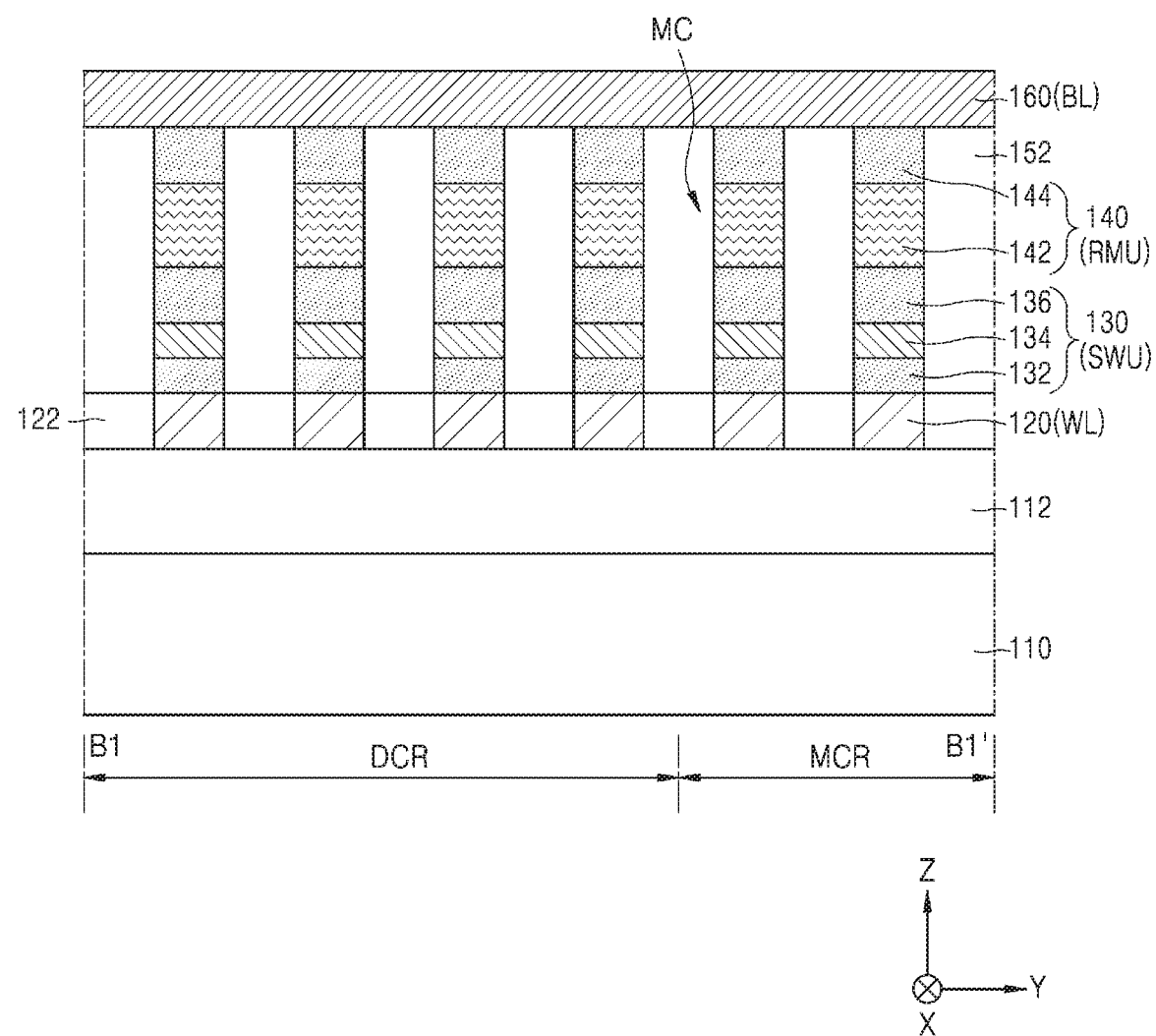

Referring to FIGS. 24A and 24B, by forming an insulating material on the switching unit 130 and the variable resistance memory unit 140, and planarizing or etching back the top side of the insulating material until the top surface of the variable resistance memory unit 140 is exposed, the second insulating layer 152 may be formed.

Next, a second conductive layer may be formed on the second insulating layer 152, and by patterning the second conductive layer, the plurality of second conductive lines 160 may be formed.

FIGS. 25A through 27B are cross-sectional views illustrating a method of manufacturing the memory device 100A according to exemplary embodiments.

Figure 25A:
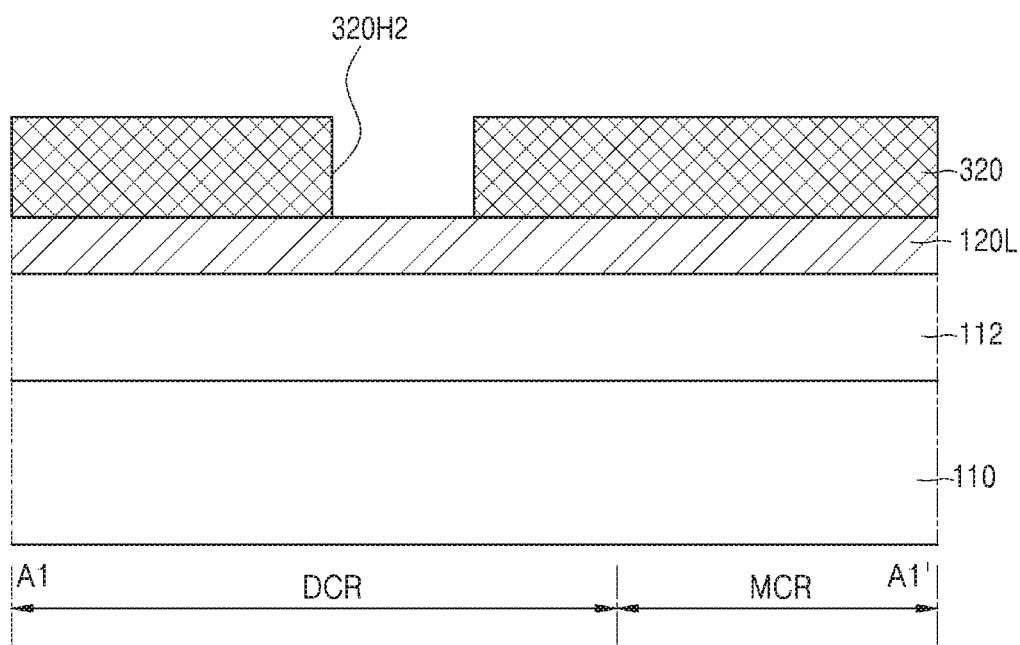
FIGS. 25A through 27B are cross-sectional views illustrating a method of manufacturing a memory device according to exemplary embodiments.
Figure 25A:
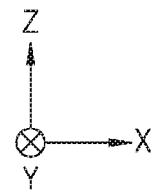
Figure 25B:
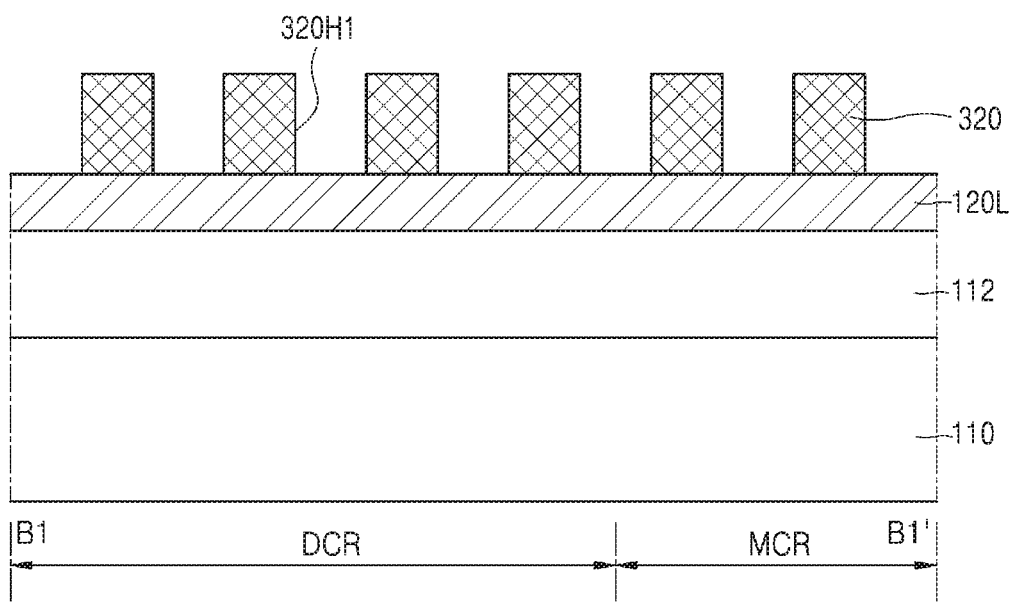

Referring to FIGS. 25A and 25B, the first conductive layer 120L may be formed on the lower insulating layer 112, and the second mask layer 320 may be formed on the first conductive layer 120L. The second mask layer 320 may include a first opening portion 320H1 extending in the first direction (X direction) and a second opening portion 320H2 extending in the second direction (Y direction).

Figure 26A:
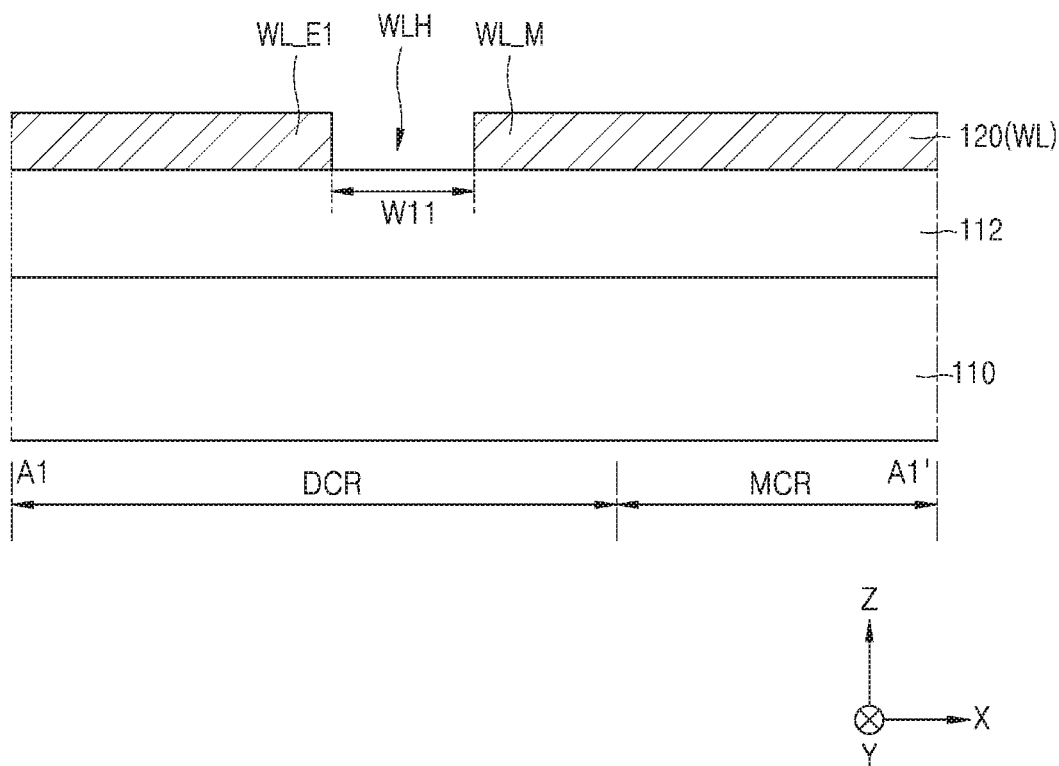
Figure 26B:
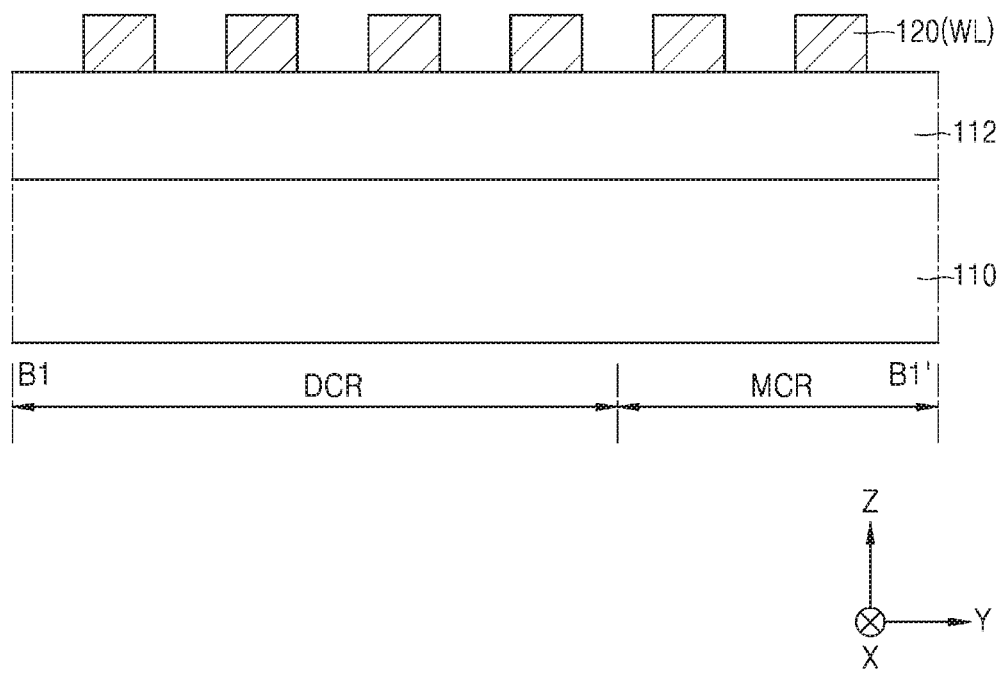

Referring to FIGS. 26A and 26B, the plurality of first conductive lines 120 may be formed by patterning the first conductive layer 120L by using the second mask layer 320 as an etching mask. As the portion of the first conductive layer 120L corresponding to the second opening 320H2 is removed together to form the opening WLH, each of the plurality of first conductive lines 120 may be separated into the first conductive line main region WL_M and the first conductive line edge region WL_E1.

Figure 27A:
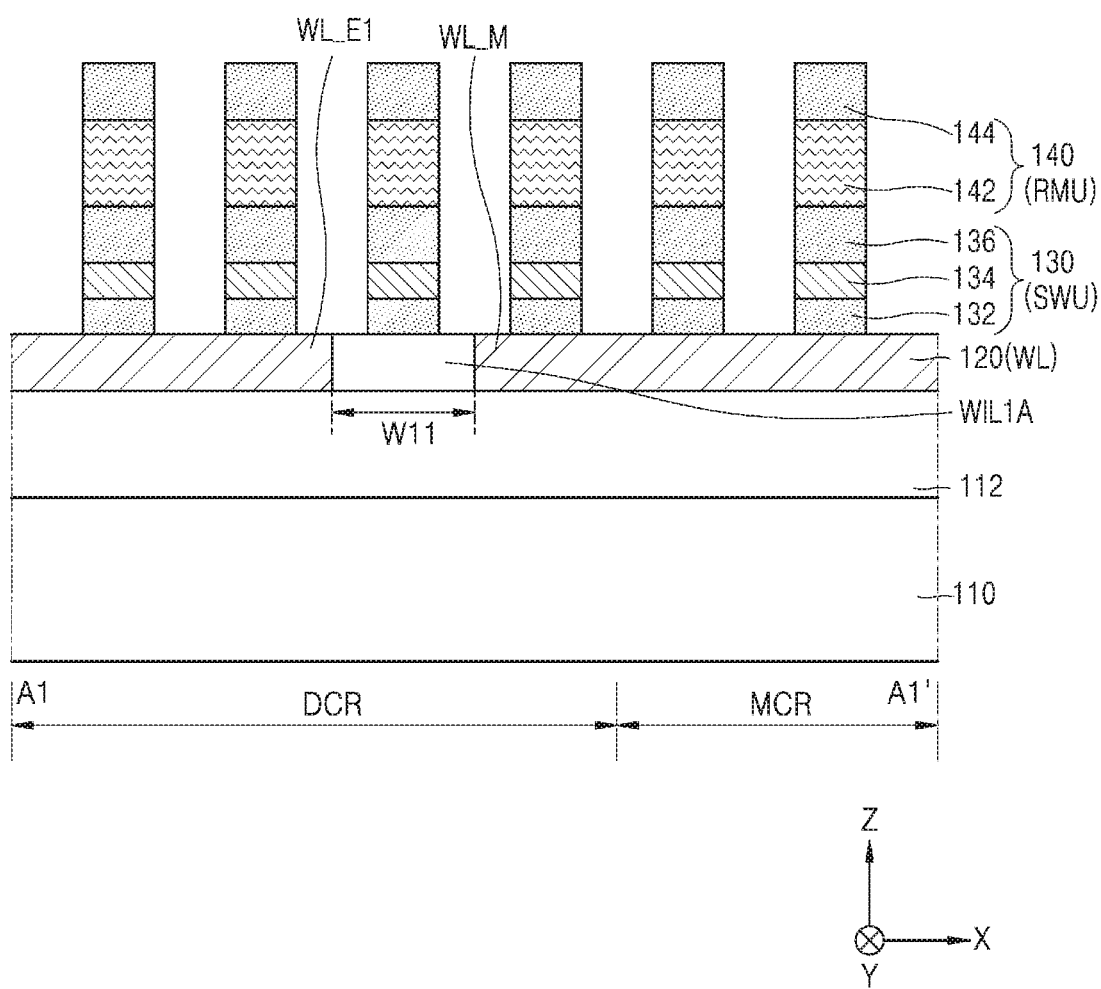
Figure 27B:
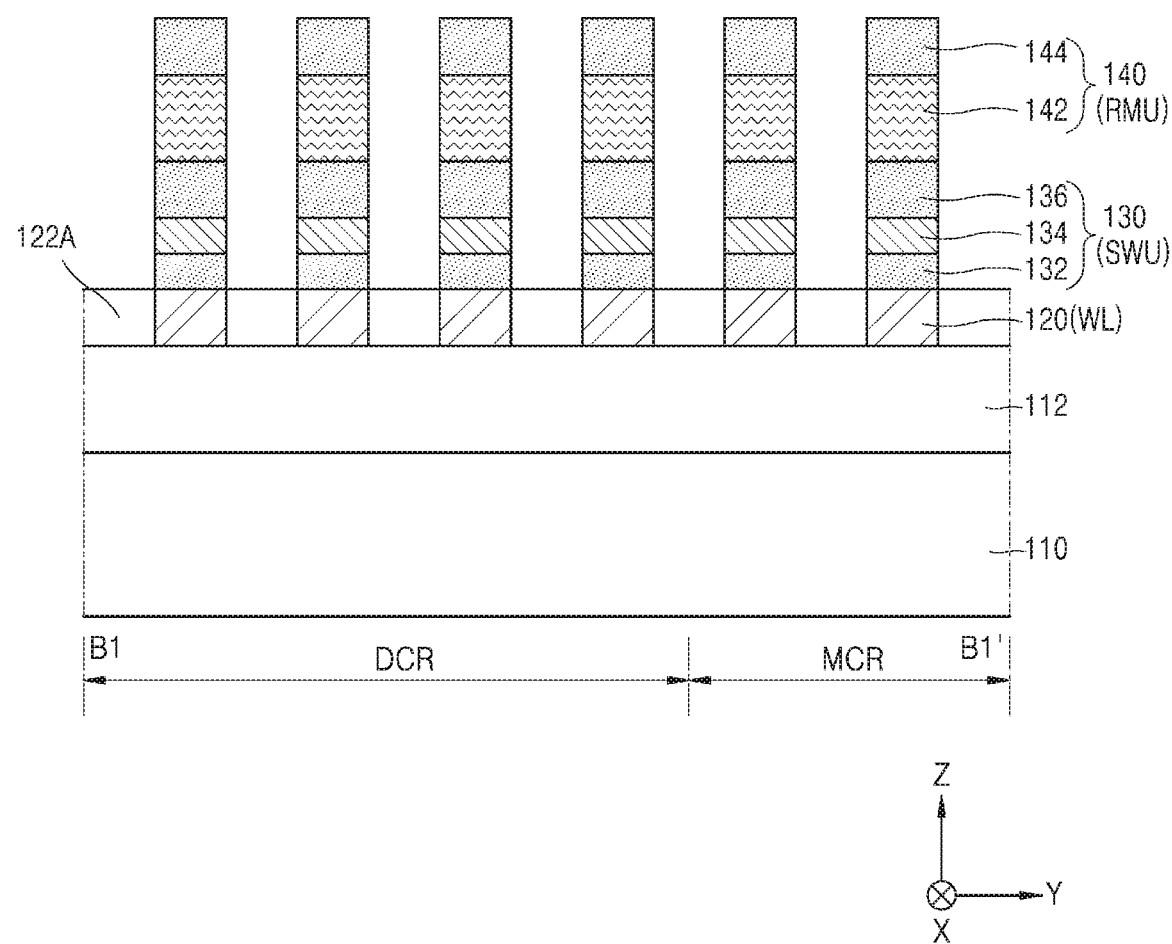

Referring to FIGS. 27A and 27B, the opening WLH may be filled with an insulating material on the plurality of first conductive lines 120, and by planarizing or etching the upper portion of the insulating material until the top surfaces of the plurality of first conductive lines 120 are exposed, the first line isolation insulating layer WIL1 and the first insulating layer 122A may be formed. As the spaces between the plurality of first conductive lines 120 are connected to the opening WLH, the first line isolation insulating layer WIL1A and the first insulating layer 122A may be formed as one continuous material layer. For example, the first line isolation insulating layer WIL1A and the first insulating layer 122A may be integrally formed.

Thereafter, the memory device 100A may be formed by performing the processes described with reference to FIGS. 23A through 24B.

FIGS. 28A through 31B are cross-sectional views illustrating a method of manufacturing the memory device 100C according to exemplary embodiments.

Figure 28A:
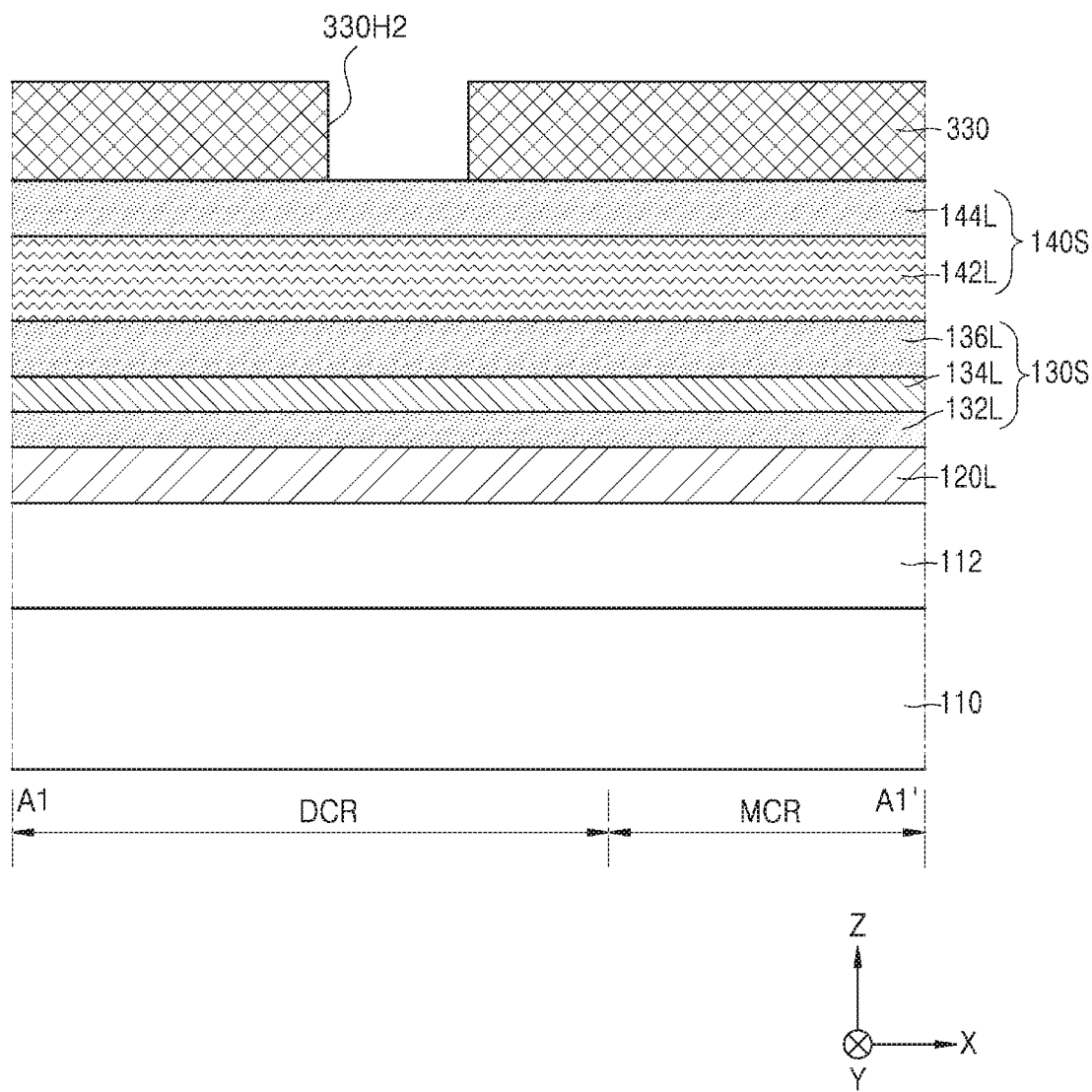
FIGS. 28A through 31B are cross-sectional views illustrating a method of manufacturing a memory device according to exemplary embodiments.
Figure 28B:
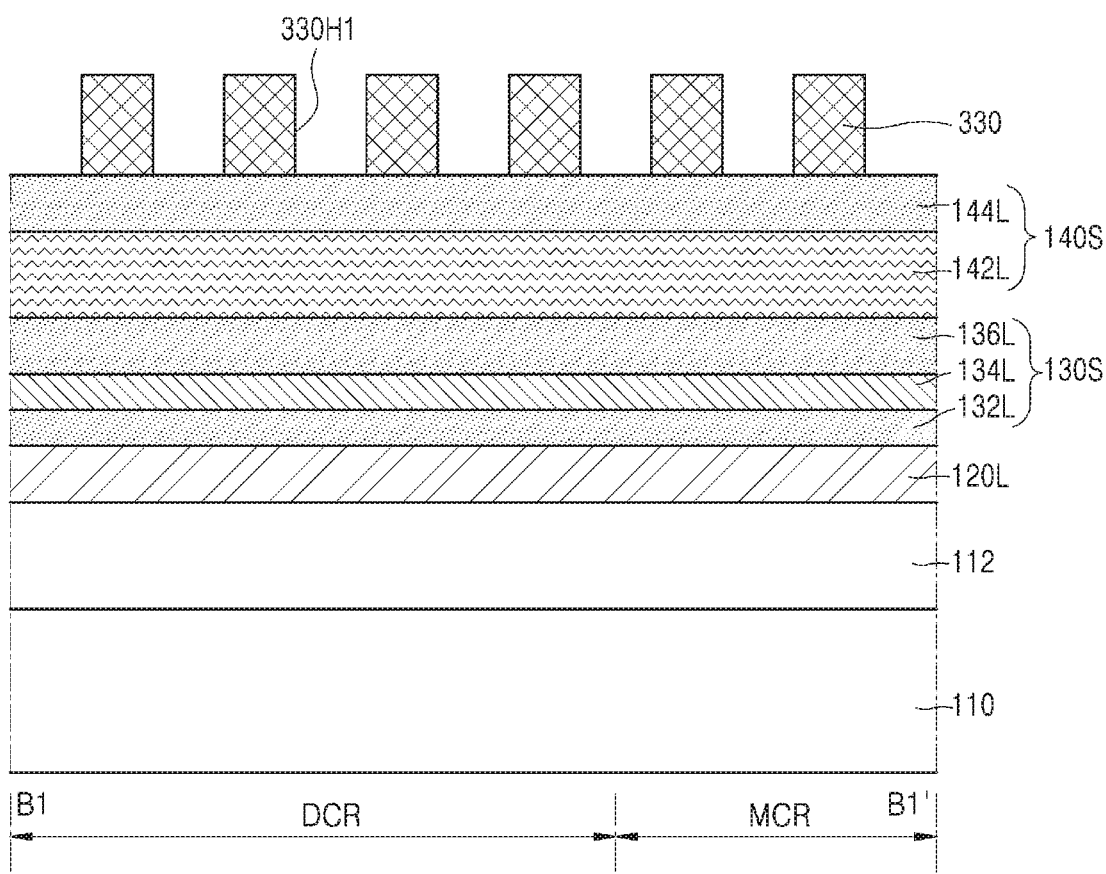

Referring to FIGS. 28A and 28B, the first conductive layer 120L, the first material layer stack 130S, and the second material layer stack 140S may be sequentially formed on the lower insulating layer 112. The first material layer stack 130S may include a first electrode material layer 132L, a preliminary switching material layer 134L, and a second electrode material layer 136L, and the second material layer stack 140S may include a variable resistance material layer 142L and a third electrode material layer 144L.

Thereafter, the third mask layer 330 may be formed on the second material layer stack 140S. The third mask layer 330 may include a first opening 330H1 extending in the first direction (X direction) and a second opening 330H2 extending in the second direction (Y direction).

Figure 29A:
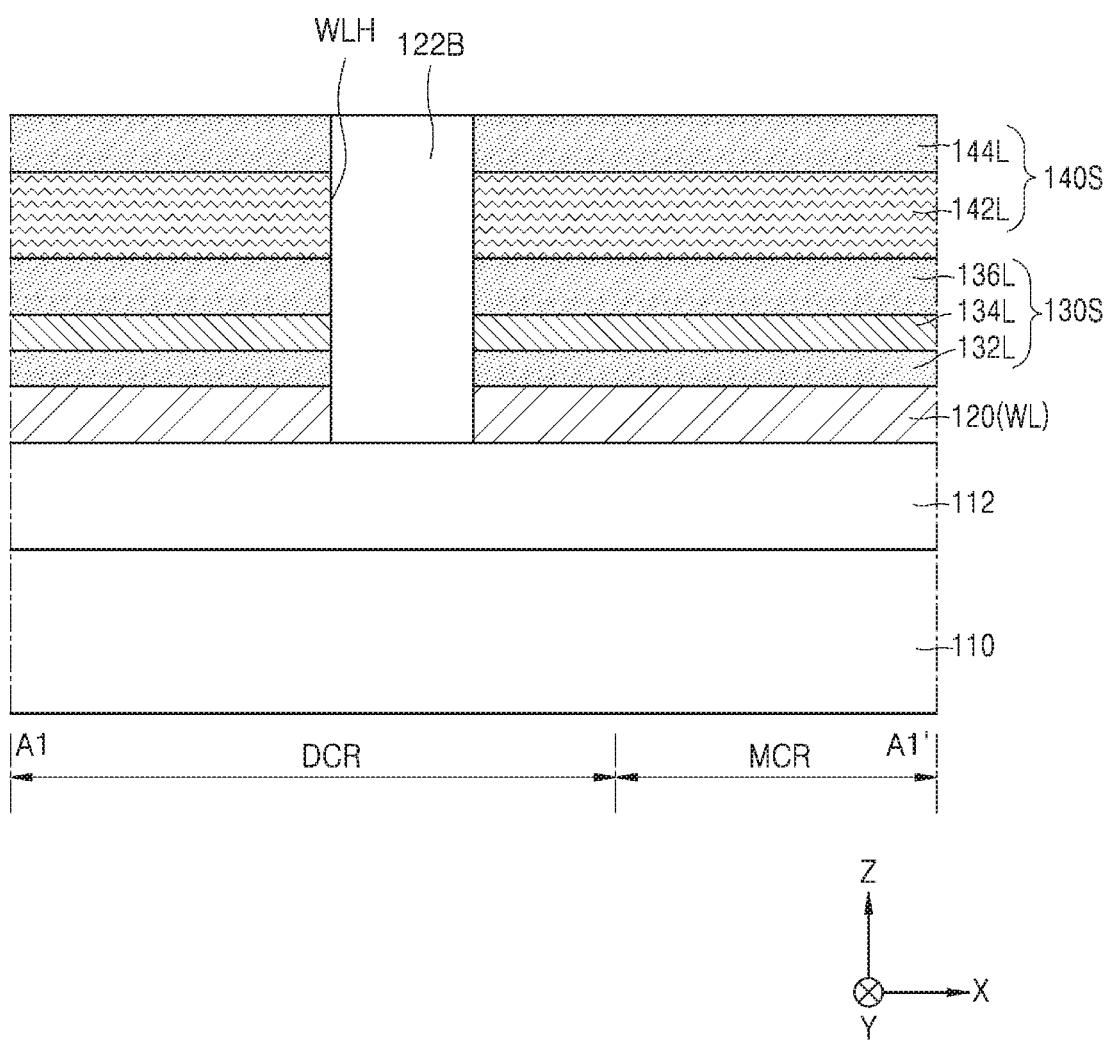
Figure 29B:
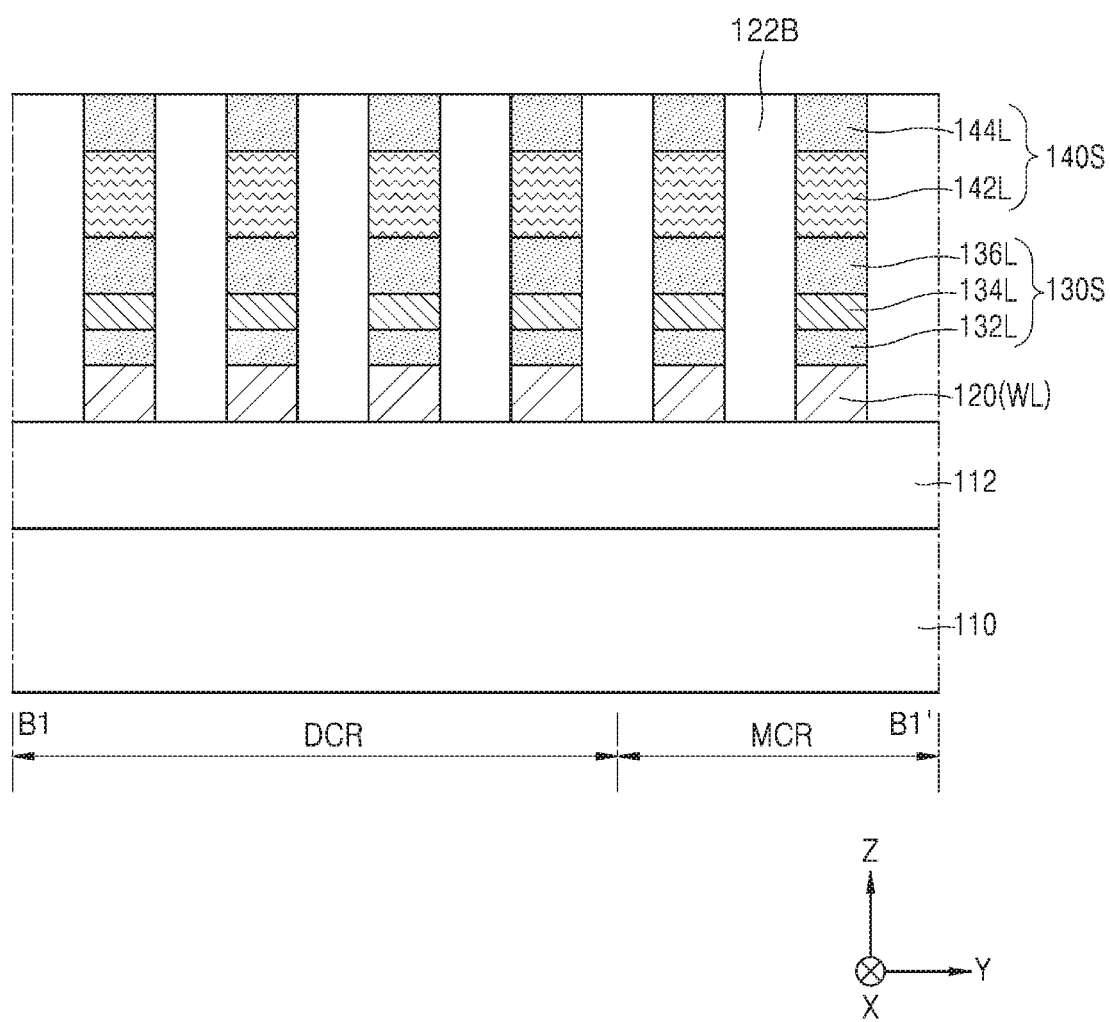

Referring to FIGS. 29A and 29B, the first conductive layer 120L, the first material layer stack 130S, and the second material layer stack 140S may be sequentially patterned by using the third mask layer 330 as an etching mask. In this case, the plurality of first conductive lines 120 may be formed, and the openings WLH may be formed at locations where the plurality of first conductive lines 120 overlaps the second openings 330H2.

Thereafter, the first insulating layer 122B filling a space from which the plurality of first conductive lines 120, the first material layer stack 130S, and the second material layer stack 140S have been removed is formed.

Figure 30A:
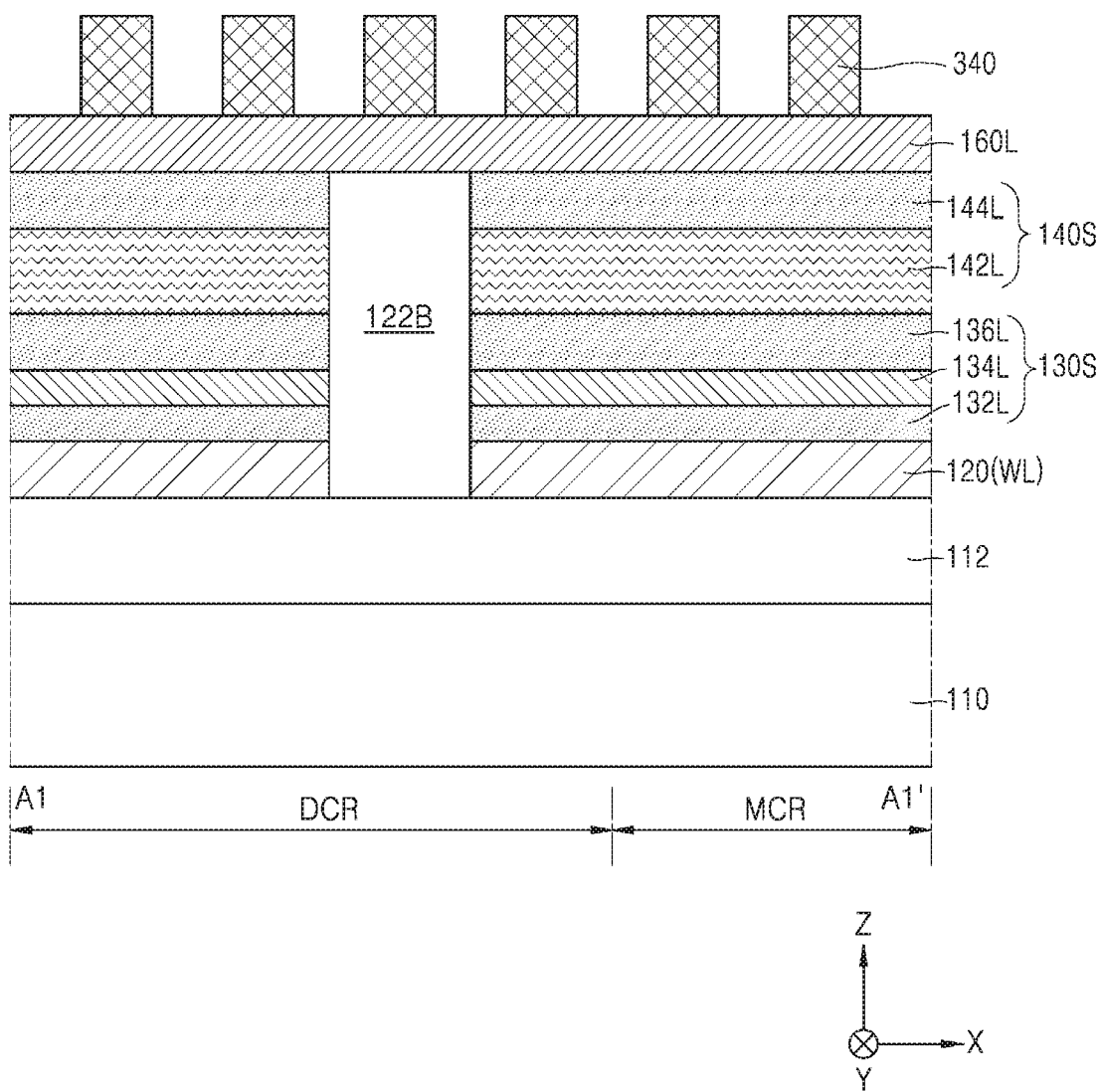
Figure 30B:
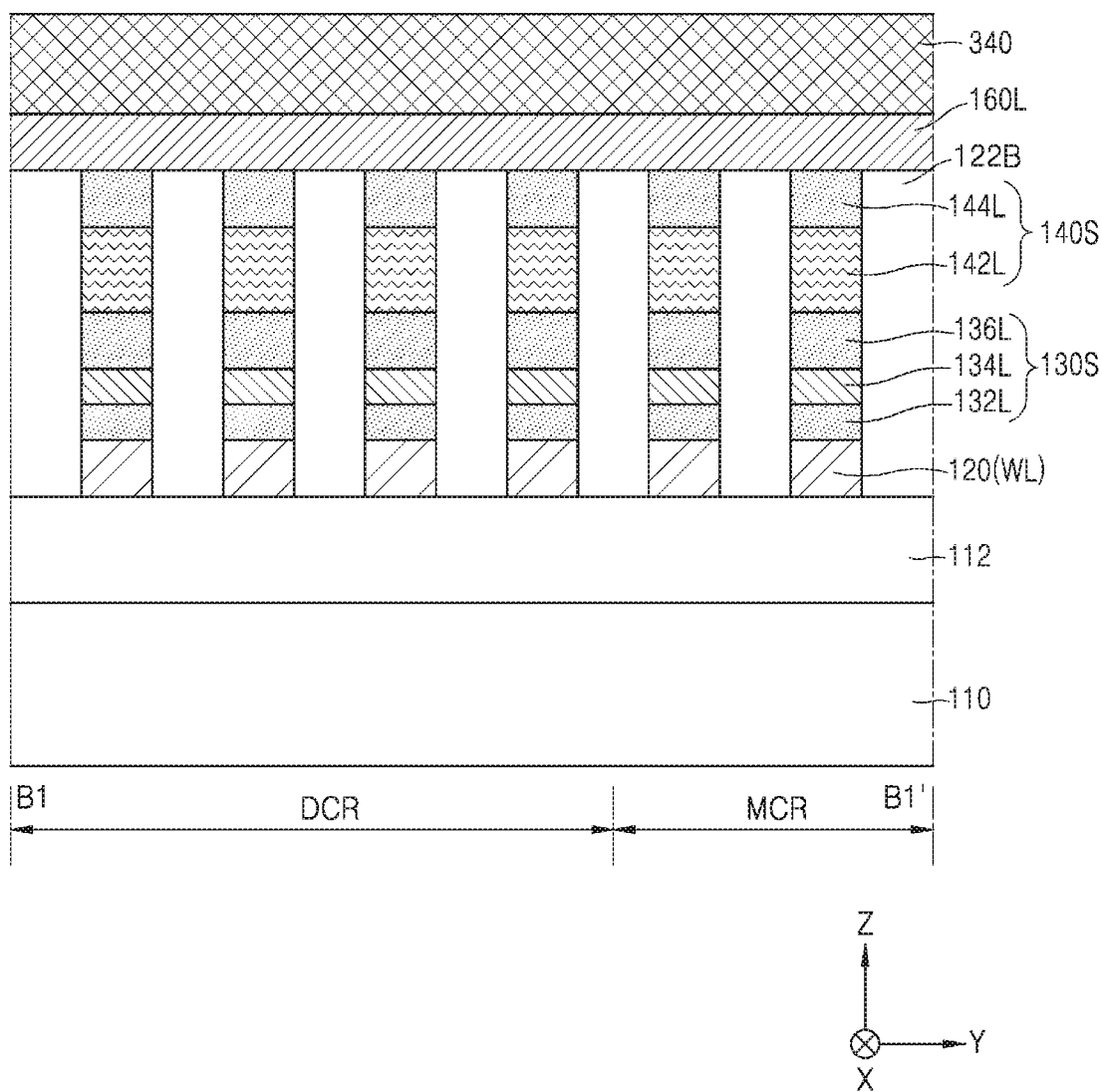
Figure 31A:
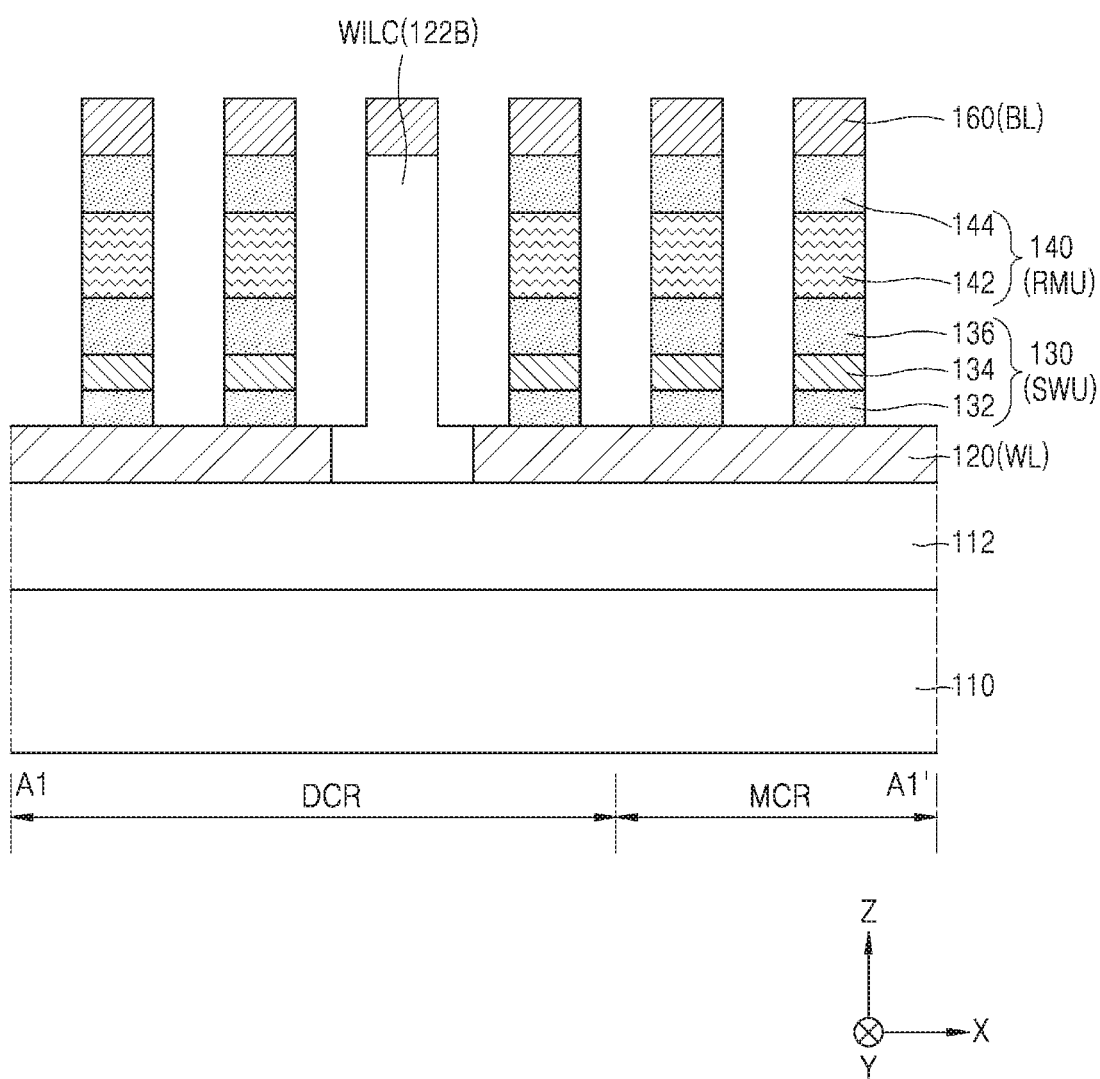
Figure 31B:
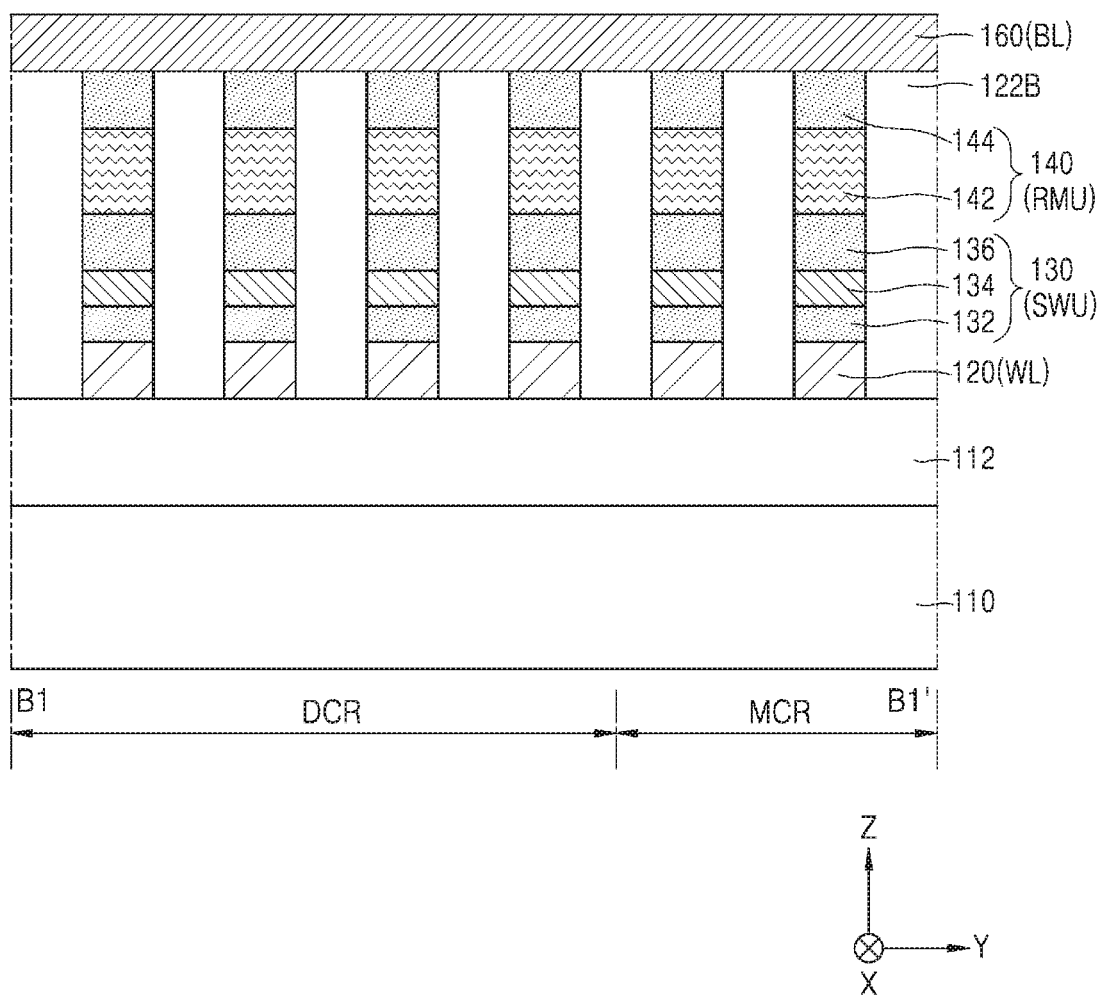

Referring to FIGS. 30A and 30B, the second conductive layer 160L may be formed on the second material layer stack 140S and the first insulating layer 122B, and a fourth mask layer 340 may be formed on the second conductive layer 160L. The fourth mask layer 340 may have a line shape extending in the second direction (Y direction).

Thereafter, by patterning the second conductive layer 160L, the first material layer stack 130S, and the second material layer stack 140S by using the fourth mask layer 340 as an etching mask, the plurality of second conductive lines 160, the switching unit 130, and the variable resistance memory unit 140 may be formed. In this case, a portion of the second conductive layer 160L not covered by the fourth mask layer 340 may be removed, and the first line isolation insulating layer WILC may be formed by removing a portion of the first insulating layer 122B formed in the opening WLH.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may include a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A memory device, comprising:
a substrate comprising a memory cell region and a dummy cell region;
a plurality of first conductive lines disposed on the substrate and extending in a first direction;
a plurality of second conductive lines disposed on the substrate and extending in a second direction; and
a plurality of memory cells formed at intersections of the plurality of first conductive lines and the plurality of second conductive lines, each of the plurality of memory cells comprising a switching unit and a variable resistance memory unit,
wherein each of the plurality of first conductive lines comprises:
a first conductive line main region disposed in the memory cell region; and
a first conductive line edge region disposed in the dummy cell region and spaced apart from the first conductive line main region,
the memory device further comprising:
a plurality of first dummy memory cells disposed in the dummy cell region, and formed at intersections of the first conductive line edge region and the second conductive lines.

2. The memory device of claim 1, wherein the first conductive line main region and the first conductive line edge region are arranged in a substantially straight line in the first direction.

3. The memory device of claim 1, further comprising:
a first line isolation insulating layer disposed on a same vertical level as the plurality of first conductive lines,
wherein the first line isolation insulating layer is disposed between the first conductive line main region and the first conductive line edge region, and extends in the second direction.

4. The memory device of claim 3, further comprising:
a first insulating layer disposed between the plurality of first conductive lines,
wherein a top surface of the first insulating layer is substantially aligned with a top surface of the first line isolation insulating layer, and
the first insulating layer is integrally formed with the first line isolation insulating layer.

5. The memory device of claim 3, further comprising:
a plurality of second dummy memory cells disposed in the dummy cell region, and spaced apart from each other on the first line isolation insulating layer in the second direction.

6. The memory device of claim 3,
wherein a top surface of the first line isolation insulating layer is substantially aligned with a top surface of the first dummy memory cells.

7. The memory device of claim 6, wherein a second conductive line overlapping the first line isolation insulating layer among the plurality of second conductive lines is disposed directly on the top surface of the first line isolation insulating layer.

8. The memory device of claim 6, wherein a top side width of the first line isolation insulating layer is less than a bottom side width of the first line isolation insulating layer.

9. The memory device of claim 3, wherein the plurality of first conductive lines is disposed on a first vertical level from a top surface of the substrate,
the first line isolation insulating layer is disposed on the first vertical level, and
the plurality of second conductive lines is disposed on a second vertical level from the top surface of the substrate that is higher than the first vertical level.

10. The memory device of claim 1, wherein
the switching unit of each of the plurality of memory cells comprises a first electrode, a switching material layer, and a second electrode that are sequentially disposed on the plurality of first conductive lines,
the variable resistance memory unit of each of the plurality of memory cells comprises a variable resistance memory layer and a third electrode that are sequentially disposed on the second electrode, and
the switching material layer comprises an ovonic threshold switching (OTS) material.

11. A memory device, comprising:
a substrate comprising a memory cell region and a dummy cell region;
a plurality of first conductive lines disposed on the substrate and extending in a first direction;
a plurality of second conductive lines disposed on the substrate and extending in a second direction;
a plurality of first memory cells formed at intersections of the plurality of first conductive lines and the plurality of second conductive lines, each of the plurality of first memory cells comprising a first switching unit and a first variable resistance memory unit; and
a first line isolation insulating layer extending in the dummy cell region in the second direction, and comprising a top surface substantially aligned with a top surface of the plurality of first conductive lines,
wherein each of the plurality of first conductive lines comprises:
a first conductive line main region disposed in the memory cell region; and
a first conductive line edge region disposed in the dummy cell region and spaced apart from the first conductive line main region with the first line isolation insulating layer disposed therebetween.

12. The memory device of claim 11, further comprising:
a plurality of first dummy memory cells formed at intersections of the first conductive line edge region and the second conductive lines, each of the plurality of first dummy memory cells comprising a second switching unit and a second variable resistance memory unit; and
a plurality of second dummy memory cells spaced apart from each other on the first line isolation insulating layer in the second direction and each comprising a third switching unit and a third variable resistance memory unit.

13. The memory device of claim 11, wherein the plurality of second conductive lines is disposed at a first pitch in the first direction,
the first line isolation insulating layer has a first width in the first direction, and
the first width is about 100% to about 300% of the first pitch.

14. The memory device of claim 11, further comprising:
a plurality of third conductive lines disposed on the plurality of second conductive lines and extending in the first direction;
a plurality of second memory cells formed at intersections of the plurality of second conductive lines and the plurality of third conductive lines, each of the plurality of second memory cells comprising a second switching unit and a second variable resistance memory unit; and
a second line isolation insulating layer extending in the dummy cell region in the first direction and comprising a top surface substantially aligned with a top surface of the plurality of second conductive lines.

15. The memory device of claim 11, further comprising:
a plurality of third conductive lines disposed on the plurality of second conductive lines and extending in the first direction;
a plurality of fourth conductive lines disposed on the plurality of third conductive lines and extending in the second direction;
a plurality of second memory cells formed at intersections of the plurality of third conductive lines and the plurality of fourth conductive lines, each of the plurality of second memory cells comprising a second switching unit and a second variable resistance memory unit; and
a second line isolation insulating layer extending in the dummy cell region in the second direction and comprising a top surface substantially aligned with a top surface of the plurality of third conductive lines.

16. The memory device of claim 15, wherein the second line isolation insulating layer vertically overlaps the first line isolation insulating layer.

17. A memory device, comprising:
a substrate comprising a memory cell region and a dummy cell region;
a plurality of first conductive lines disposed on the substrate and extending in a first direction;
a plurality of second conductive lines disposed on the plurality of first conductive lines and extending in a second direction;
a plurality of third conductive lines disposed on the plurality of second conductive lines and extending in the first direction;
a plurality of memory cells formed at intersections of the plurality of first conductive lines and the plurality of second conductive lines and at intersections of the plurality of second conductive lines and the plurality of third conductive lines, each of the plurality of memory cells comprising a switching unit and a variable resistance memory unit;
a first line isolation insulating layer extending in the dummy cell region in the second direction, and comprising a top surface that is substantially aligned with a top surface of the plurality of first conductive lines; and
a second line isolation insulating layer extending in the dummy cell region in the first direction and comprising a top surface that is substantially aligned with a top surface of the plurality of second conductive lines.

18. The memory device of claim 17, wherein
each of the plurality of first conductive lines comprises a first conductive line main region disposed in the memory cell region, and a first conductive line edge region disposed in the dummy cell region and spaced apart from the first conductive line main region, and
each of the plurality of second conductive lines comprises a second conductive line main region disposed in the memory cell region, and a second conductive line edge region disposed in the dummy cell region and spaced apart from the second conductive line main region.

19. The memory device of claim 18, wherein
the first conductive line main region and the first conductive line edge region are disposed in a substantially straight line in the first direction, and
the second conductive line main region and the second conductive line edge region are disposed in a substantially straight line in the second direction.

20. The memory device of claim 18, further comprising:
a plurality of first dummy memory cells formed at intersections of the first conductive line edge region and the plurality of second conductive lines;
a plurality of second dummy memory cells spaced apart from each other between the first line isolation insulating layer and a second conductive line among the plurality of second conductive lines corresponding thereto in the second direction;
a plurality of third dummy memory cells formed at intersections of the second conductive line edge region and the plurality of third conductive lines; and a plurality of fourth dummy memory cells spaced apart from each other between the second line isolation insulating layer and a third conductive line among the plurality of third conductive lines corresponding thereto in the first direction.

\* \* \* \* \*